(12) United States Patent
Oh et al.

(10) Patent No.: US 12,167,596 B2
(45) Date of Patent: Dec. 10, 2024

(54) THREE-DIMENSIONAL SEMICONDUCTOR DEVICES AND METHOD OF MANUFACTURING THE SAME

(71) Applicant: Samsung Electronics Co., Ltd., Suwon-si (KR)

(72) Inventors: Seungha Oh, Seoul (KR); Weonhong Kim, Suwon-si (KR); Hoonjoo Na, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/150,523

(22) Filed: Jan. 5, 2023

(65) Prior Publication Data

US 2023/0164994 A1    May 25, 2023

Related U.S. Application Data

(62) Division of application No. 17/160,874, filed on Jan. 28, 2021, now Pat. No. 11,552,096.

(30) Foreign Application Priority Data

Jun. 12, 2020   (KR) ........................ 10-2020-0071811

(51) Int. Cl.
*H10B 43/20*   (2023.01)
*H10B 12/00*   (2023.01)
(Continued)

(52) U.S. Cl.
CPC ............. *H10B 43/20* (2023.02); *H10B 12/30* (2023.02); *H10B 41/10* (2023.02); *H10B 41/20* (2023.02);
(Continued)

(58) Field of Classification Search
CPC ......... H01L 27/11578; H01L 27/10805; H01L 27/11519; H01L 27/11524;
(Continued)

(56) References Cited

U.S. PATENT DOCUMENTS 8,394,694 B2   3/2013   Lavoie et al.
9,299,802 B2   3/2016   Ando et al.
(Continued)

FOREIGN PATENT DOCUMENTS

KR    2003/0002693 A    1/2003
KR    2009/0105445 A    10/2009
KR    2009/0129954 A    12/2009

OTHER PUBLICATIONS

Notice of Allowance dated Sep. 14, 2022, issued in related U.S. Appl. No. 17/160,874.
(Continued)

*Primary Examiner* — Shahed Ahmed
*Assistant Examiner* — Khatib A Rahman
(74) *Attorney, Agent, or Firm* — HARNESS, DICKEY & PIERCE, P.L.C.

(57) ABSTRACT

A three-dimensional semiconductor device includes a first substrate; a plurality of first transistors on the first substrate; a second substrate on the plurality of first transistors; a plurality of second transistors on the second substrate; and an interconnection portion electrically connecting the plurality of first transistors and the plurality of second transistors. Each of the plurality of first transistors includes a first gate insulating film on the first substrate and having a first hydrogen content. Each of the plurality of second transistors includes a second gate insulating film on the second substrate and having a second hydrogen content. The second hydrogen content is greater than the first hydrogen content.

20 Claims, 28 Drawing Sheets

(51) Int. Cl.
  *H10B 41/10* (2023.01)
  *H10B 41/20* (2023.01)
  *H10B 41/35* (2023.01)
  *H10B 43/10* (2023.01)
  *H10B 43/35* (2023.01)
(52) U.S. Cl.
  CPC ............. *H10B 41/35* (2023.02); *H10B 43/10* (2023.02); *H10B 43/35* (2023.02)
(58) Field of Classification Search
  CPC ......... H01L 27/11551; H01L 27/11565; H01L 27/1157; H01L 21/8221; H01L 21/823462; H01L 27/088; H01L 21/28079; H01L 21/28088; H01L 29/66545; H01L 21/28176; H01L 29/6659; H01L 27/10823; H01L 27/11582; H01L 28/40; H01L 27/0688; H01L 23/5283; H01L 27/1244; H01L 27/1248; H01L 27/1259; H01L 21/0234; H01L 21/76834; H01L 21/76898; H01L 27/105; H10B 43/20; H10B 12/30; H10B 41/10; H10B 41/20; H10B 41/35; H10B 43/10; H10B 43/35; H10B 12/34; H10B 43/27
  See application file for complete search history.

(56) References Cited

U.S. PATENT DOCUMENTS

| | | | |
|---|---|---|---|
| 9,691,869 | B2 | 6/2017 | Or-Bach et al. |
| 9,711,373 | B2 | 7/2017 | Chang et al. |
| 10,573,627 | B2 | 2/2020 | Fong et al. |
| 11,018,134 | B2* | 5/2021 | Lin ................... H01L 23/5226 |
| 2006/0091474 | A1 | 5/2006 | Nabatame et al. |
| 2008/0166890 | A1 | 7/2008 | Hwang |
| 2009/0311876 | A1 | 12/2009 | Terasaki |
| 2014/0120707 | A1 | 5/2014 | Ando et al. |
| 2016/0064227 | A1* | 3/2016 | Go ........................ H10B 41/27 438/585 |
| 2017/0207242 | A1* | 7/2017 | Yamazaki ......... H01L 29/66969 |
| 2017/0294541 | A1 | 10/2017 | Yamazaki |
| 2018/0033892 | A1* | 2/2018 | Yamane ........... H01L 29/78696 |
| 2019/0051691 | A1 | 2/2019 | Hayashi |
| 2020/0266229 | A1* | 8/2020 | Takahashi ......... H01L 27/14636 |
| 2021/0020628 | A1* | 1/2021 | Oh ....................... H10B 63/30 |

OTHER PUBLICATIONS

Korean Office Action dated Oct. 26, 2024 for corresponding Korean Patent Application No. 2020/0071811 and its English-language translation.

\* cited by examiner

THREE-DIMENSIONAL SEMICONDUCTOR DEVICES AND METHOD OF MANUFACTURING THE SAME

CROSS-REFERENCE TO RELATED APPLICATION(S)

This application is a divisional of U.S. application Ser. No. 17/160,874, filed Jan. 28, 2021, which claims benefit of priority to Korean Patent Application No. 10-2020-0071811, filed on Jun. 12, 2020 in the Korean Intellectual Property Office, the disclosure of each of which is incorporated by reference herein in its entirety.

BACKGROUND

Inventive concepts relate to a three-dimensional semiconductor device and/or a method of manufacturing the same.

In semiconductor devices, a dielectric material is widely used as a major component. In recent years, as a degree of integration of semiconductor devices has increased, a dielectric having a high dielectric constant has been employed. However, such a dielectric may have chemical instability. For example, a trap such as an oxygen vacancy may occur in a dielectric constituting a gate insulating film, which may adversely affect reliability of the semiconductor device.

SUMMARY

An aspect of inventive concepts is a three-dimensional semiconductor device having improved reliability. The reliability may be improved by improving characteristics of a dielectric film employed in the semiconductor device.

Another aspect of inventive concepts is a method of manufacturing a semiconductor device having improved reliability. The reliability may be improved by improving characteristics of a dielectric film employed in the semiconductor device.

According to an embodiment of inventive concepts, a three-dimensional semiconductor device includes a first substrate, a plurality of first transistors on the first substrate, a second substrate on the plurality of first transistors, a plurality of second transistors on the second substrate, and an interconnection portion electrically connecting the plurality of first transistors and the plurality of second transistors. Each of the plurality of first transistors includes a first gate insulating film on the first substrate, a first gate electrode on the first gate insulating film, and a first source/drain region on the first substrate at both sides of the first gate electrode. The first gate insulating film has a first hydrogen content. Each of the plurality of second transistors includes a second gate insulating film on the second substrate, a second gate electrode on the second gate insulating film, and a second source/drain region on the second substrate at both sides of the second gate electrode. The second gate insulating film has a second hydrogen content that may be greater than the first hydrogen content.

According to an embodiment of inventive concepts, a three-dimensional semiconductor device includes a first substrate, a plurality of first transistors on the first substrate, a second substrate on the plurality of first transistors, a plurality of second transistors on the second substrate, a plurality of first conductive lines between the plurality of first transistors and the second substrate, a plurality of second conductive lines on the plurality of second transistors and electrically connected to the plurality of second transistors, and a through-via. Each of the plurality of first transistors has a first gate insulating film and a first gate electrode on the first gate insulating film. A thickness of the second substrate is less than a thickness of the first substrate. Each of the plurality of second transistors has a second gate insulating film and a second gate electrode on the second gate insulating film. The second gate insulating film and the first gate insulating film have a same dielectric material. A hydrogen content of the second gate insulating film may be 10% or more greater than a hydrogen content of the first gate insulating film. The plurality of first conductive lines may be electrically connected to the plurality of first transistors. The through-via may penetrate through the second substrate and connect the plurality of first conductive lines and the plurality of second conductive lines.

According to an embodiment of inventive concepts, a three-dimensional semiconductor device includes a first substrate, a plurality of first transistors each having a first gate insulating film on an upper surface of the first substrate and a first gate electrode on the first gate insulating film, a second substrate on the plurality of first transistors, a plurality of second transistors each having a second gate insulating film on an upper surface of the second substrate and a second gate electrode on the second gate insulating film, and an interconnection portion electrically connecting the plurality of first transistors and the plurality of second transistors. A thickness of the second substrate may be lower than a thickness of the first substrate. The second gate insulating film and the first gate insulating film may have a same dielectric material. A hydrogen content of the second gate insulating film may be 10% or more greater than a hydrogen content of the first gate insulating film.

According to an embodiment of inventive concepts, a method of manufacturing a semiconductor device includes preparing a semiconductor substrate having an active region; forming a gate stack on the active region, the gate stack including a gate insulating film and a gate electrode; and performing a reduction treatment on the gate stack using hydrogen radicals or hydrogen plasma.

According to an embodiment of inventive concepts, a method of manufacturing a semiconductor device includes forming a plurality of first transistors on a first substrate, the plurality of first transistors each having a first gate insulating film and a first gate electrode on the first substrate; forming a first conductive line on the plurality of first transistors; forming a second substrate on the first conductive line; forming a plurality of second transistors on the second substrate, the plurality of second transistors each having a second gate insulating film and a second gate electrode; and forming a second conductive line and a through-via on the plurality of second transistors. The forming the plurality of second transistors includes forming a gate stack on the first substrate and performing a reduction treatment on the gate stack using hydrogen radicals or hydrogen plasma. The gate stack includes a second gate insulating film and a second gate electrode. The through-via connects the first conductive line and the second conductive line.

BRIEF DESCRIPTION OF DRAWINGS

The above and other aspects, features, and effects of inventive concepts will be more clearly understood from the following detailed description, taken in conjunction with the accompanying drawings, in which.

DETAILED DESCRIPTION

Hereinafter, example embodiments of inventive concepts will be described in detail with reference to the accompanying drawings.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIGS. 1A to 1E are cross-sectional views for operations in a method of manufacturing a semiconductor device according to an example embodiment of inventive concepts. The semiconductor device manufactured in the present example embodiment may include a FET device such as a MOSFET.

Figure 1A:
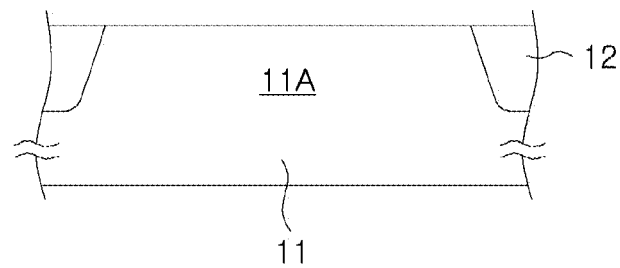
FIGS. 1A to 1E are cross-sectional views for operations in a method of a semiconductor device according to an example embodiment of inventive concepts.

Referring to FIG. 1A, a semiconductor substrate 11 may have an active region 11A defined by a device isolation portion 12.

A trench defining the active region 11A may be formed in the semiconductor substrate 11 to a desired and/or alternatively predetermined depth, and a device isolation portion 12 defining the active region 11A may be formed by forming an insulating film such as a silicon oxide film in the trench by plasma chemical vapor deposition (PECVD).

For example, the semiconductor substrate 11 may include a single semiconductor substrate such as a silicon substrate, a germanium substrate, or a silicon-germanium substrate, or a composite substrate such as a silicon-on-insulator (SOI) substrate or a germanium-on-insulator (germanium-on-insulation: GOI).

Meanwhile, the semiconductor substrate 11 may further include a p-type or n-type well. For example, in the case of an n-type MOSFET, an n-type well doped with impurities such as phosphorus (P) or arsenic (As) may be formed, and in the case of a p-type MOSFET, a p-type well is formed with an impurity such as boron (B) may be formed.

The active region 11A may provide a channel layer. In the present example embodiment, the active region 11A is illustrated as a general flat structure, but is not limited thereto, and a three-dimensional structure such as a fin shape or a structure such as a wire may be used.

Figure 1B:
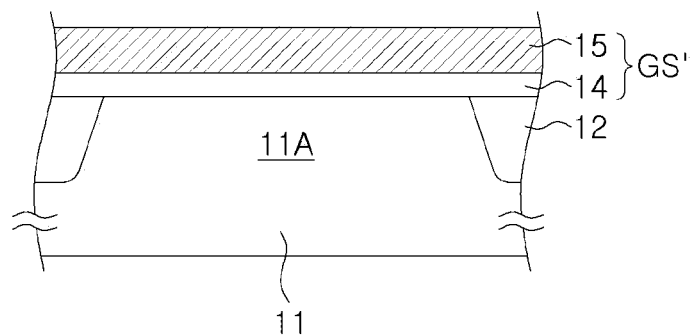

Referring to FIG. 1B, a gate insulating film 14 and a gate electrode 15 may be sequentially formed on the semiconductor substrate.

The gate insulating film 14 may include a high dielectric material having a high dielectric constant (e.g., 10 or more), as well as silicon oxide ($SiO_2$), silicon nitride ($SiN_x$), or silicon oxynitride (SiON). For example, as the high-k material, at least one high dielectric constant selected from a group consisting of hafnium oxide film ($HfO_2$), a hafnium silicon oxide film (HfSiO), a hafnium silicon oxynitride film (HfSiON), a hafnium oxynitride film (HfON), a hafnium aluminum oxide film (HfAlO), a hafnium lanthanum oxide film (HfLaO), Zirconium oxide film ($ZrO_2$), tantalum oxide film ($TaO_2$), zirconium silicon oxide film (ZrSiO), lanthanum oxide film ($La2O_3$), praseodymium oxide film ($Pr_2O_3$) dysprosium oxide film ($Dy_2O_3$) may be used. In some example embodiments, the gate insulating film 14 may be formed of two or more dielectric layers (see FIG. 2F).

The gate electrode 15 may be formed on the gate insulating film 14 in a subsequent process. For example, the gate electrode 14 may include metal such as copper (Cu), titanium (Ti), tantalum (Ta), ruthenium (Ru), tungsten (W), cobalt (Co), nickel (Ni), aluminum (Al), hafnium (Hf).), metals such as zirconium (Zr), palladium (Pd), platinum (Pt), and molybdenum (Mo), or silicides such as WSi, nitrides or oxynitrides such as TiN, TaN, TiON, TaON. A natural oxide film or a separate capping layer ("57" in FIG. 6B, and "77" in FIG. 7B) may be additionally formed on the gate electrode 15. In the present specification, a stack of the gate insulating film and the gate electrode is also referred to as a "gate stack."

Figure 1C:
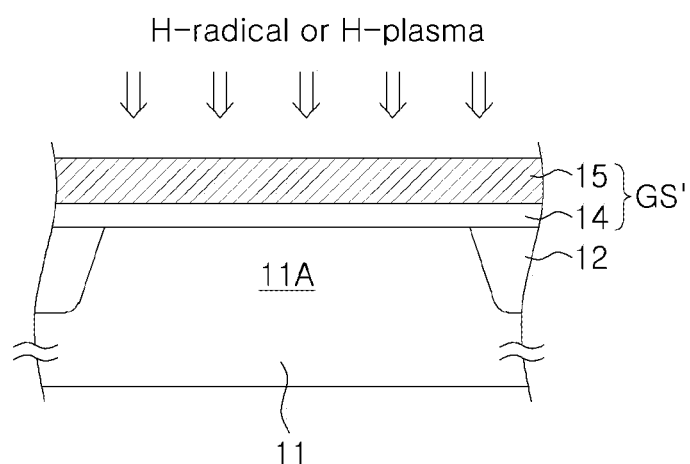

Next, referring to FIG. 1C, a reduction treatment is performed on the gate stack GS' using hydrogen radicals or hydrogen plasma.

This reduction treatment uses highly reactive hydrogen radicals, and can be performed by various processes. For example, the reduction treatment may be performed by generating hydrogen radicals outside a chamber in which the semiconductor substrate 11 is disposed, and then supplying hydrogen radicals into the chamber, or by generating hydrogen plasma in the chamber in which the semiconductor substrate 11 is disposed.

In this reduction process, a quality of the gate insulating film 14 may be greatly improved by curing to fill an oxygen vacancy present in the gate insulating film 14. Specifically, through a curing action by the reduction treatment, the gate insulating film can greatly improve negative bias temperature instability (NBTI), which is a reliability index, and a leakage current characteristic can be improved. This operation will be described later with reference to FIG. 3.

The reduction treatment using hydrogen radicals (or hydrogen plasma) employed in the present example embodiment can improve the quality of the gate insulating film 14 by replacing the conventional high-temperature (e.g., 900° C.) annealing process. In particular, since the reduction treatment using hydrogen radicals can be performed even at a temperature, lower than a normal annealing temperature, it can be advantageously used in an environment requiring a low-temperature process. The reduction treatment using hydrogen radicals is not limited thereto, but, for example, it is performed at 600° C. or lower, so that a desired curing effect can be expected.

In the present embodiment, only a reduction treatment using hydrogen radicals (or hydrogen plasma) is described, but when plasma is generated for the reduction treatment, another reducing gas-containing plasma may be additionally generated. For example, the other reducing gas may include at least one selected from a group constituting Ar, He, $N_2$, $NH_3$, and hydrogen (H) isotopes.

In a specific example embodiment, the reduction treatment may be performed in an atmosphere containing oxygen or an oxygen isotope, or an oxygen-containing plasma may be added. In this case, this oxygen element can be used to generate highly activated oxygen curing a trap. Therefore, even in an environment in which an oxide film such as a natural oxide film does not exist, the quality of the gate insulating film 14 can be improved through the reduction treatment according to the present example embodiment.

Figure 1D:
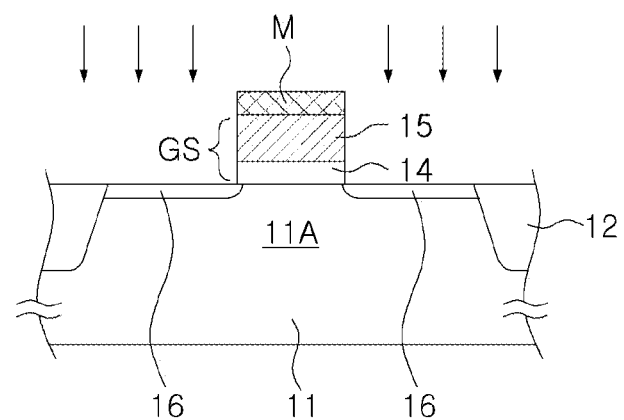

Next, referring to FIG. 1D, a gate structure GS may be formed, and a first doped region 16 may be formed on the semiconductor substrate 11 using an ion implantation process.

In this process, a gate structure GS of a desired shape may be formed by performing selective etching using a mask M, and then the first doped region 16 may be formed using the mask M and the gate structure GS as an ion implantation mask. The first impurity region 16 may be positioned above the semiconductor substrate 11 adjacent to the gate structure GS. The impurity of the first doped region 16 may be an n-type impurity such as arsenic (As) or a p-type impurity such as boron B. The first doped region 16 may be formed to be shallow at a low concentration, and generally may have a conductivity type opposite to that of an impurity in a well.

Figure 1E:
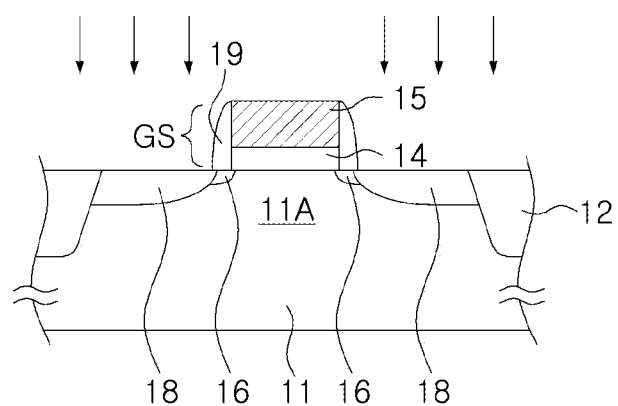

Next, referring to FIG. 1E, a sidewall spacer 19 may be formed on a sidewall of the gate structure GS, and a second doped region 18 may be formed using a secondary ion implantation process. The sidewall spacers 19 may be formed of silicon oxide, silicon nitride, silicon oxynitride, or a combination thereof. Subsequently, the second doped region 18 may be formed on the semiconductor substrate 11 by using the gate structure GS and the sidewall spacer 19 as an ion implantation mask. The second doped region 18 may be positioned above the semiconductor substrate 11 adjacent to the gate structure GS and the sidewall spacer 19. After the ion implantation process for the second doped region 18, a heat treatment process may be further performed.

Through such an ion implantation process, the first and second doped regions 16 and 18 may be provided as source/drain regions, and a MOS transistor including the source/drain regions and the gate structure GS may be completed.

As described above, it is possible to improve the reliability and leakage current characteristics of the gate insulating film by curing a trap such as an oxygen vacancy by replacing the conventional annealing process with a reduction treatment using hydrogen radicals or the like.

In a method of manufacturing a semiconductor device (MOSFET) according to example embodiments, an example in which the reduction treatment process is formed before the ion implantation process for forming the source/drain regions is described, but in other manufacturing processes, the reduction treatment may be performed after the ion implantation process (see FIGS. 2A to 2G).

FIGS. 2A to 2G are cross-sectional views for operations in a method of manufacturing a semiconductor device according to an example embodiment of inventive concepts.

Figure 2A:
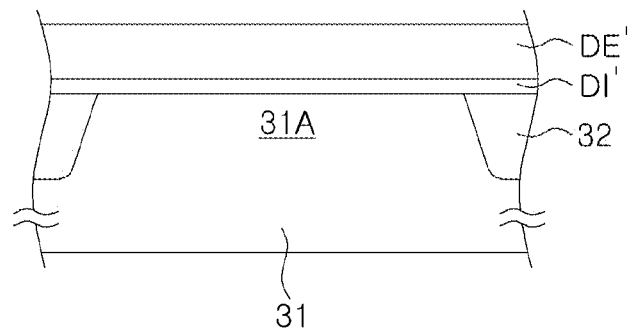
FIGS. 2A to 2G are cross-sectional views for operations in a method of a semiconductor device according to an example embodiment of inventive concepts.

Referring to FIG. 2A, a dummy insulating layer DI' and a dummy electrode layer DE' may be sequentially formed on an active region 31A of a semiconductor substrate 31.

It may have an active region 31A defined by a device isolation portion 32 on the semiconductor substrate 31, and a dummy insulating layer DI' and a dummy electrode layer DE' may be stacked on the active region 31A.

For example, the dummy insulating layer DI' may include a silicon oxide layer ($SiO_2$). The dummy insulating layer DI' may be formed using a chemical vapor deposition (CVD), atomic layer deposition (ALD), or a thermal oxidation process. For example, the dummy electrode layer DE' may include polysilicon formed by chemical vapor deposition.

Figure 2B:
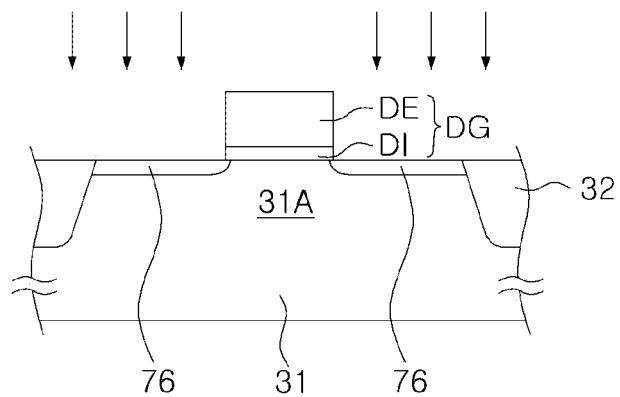

Next, referring to FIG. 2B, a dummy gate structure DG may be formed, and a first doped region 76 may be formed on the semiconductor substrate 31 using a first ion implantation process.

In this process, a dummy gate structure DG may be formed using a selective etching process using a mask similar to the process of FIG. 1D, and then, the dummy gate structure DG may be used as an ion implantation mask to form a first doped region 36. The first doped region 36 may be positioned above the semiconductor substrate 31 adjacent to the dummy gate structure DG.

Figure 2C:
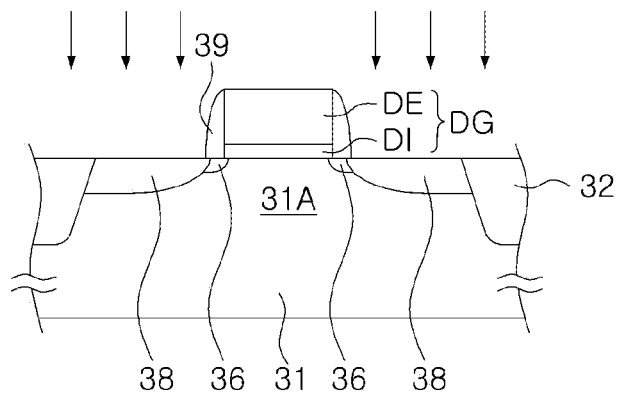

Subsequently, referring to FIG. 2C, a sidewall spacer 39 may be formed on a sidewall of the dummy gate structure DG, and a second doped region 38 may be formed using a secondary ion implantation process.

For example, the sidewall spacer 39 may be formed of silicon oxide, silicon nitride, silicon oxynitride, or a combination thereof. Subsequently, the second doped region 38 may be formed on the semiconductor substrate 31 by using the dummy gate structure DG and the sidewall spacer 39 as an ion implantation mask. The second doped region 38 may be positioned above the semiconductor substrate 31 adjacent to the dummy gate structure DG and the sidewall spacer 39. After the ion implantation process for the second doped region 38, a heat treatment process may be further performed. As described above, the first and second doped regions 36 and 38 may be provided as source/drain regions.

Figure 2D:
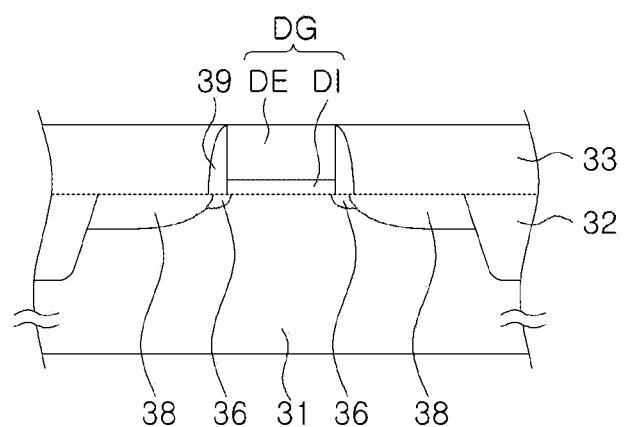

Next, referring to FIG. 2D, a mold insulating film 33 may be formed on the semiconductor substrate 31. For example, the mold insulating film 33 may include a silicon oxide film, a silicon oxynitride, or a silicon nitride. The mold insulating film 33 may be formed by low pressure chemical vapor deposition (LPCVD) or plasma chemical vapor deposition (PECVD), and then planarized to expose the dummy gate layer DE. The planarization of the mold insulating film 33 may be performed by a chemical mechanical polishing (CMP) process or an etchback process.

Figure 2E:
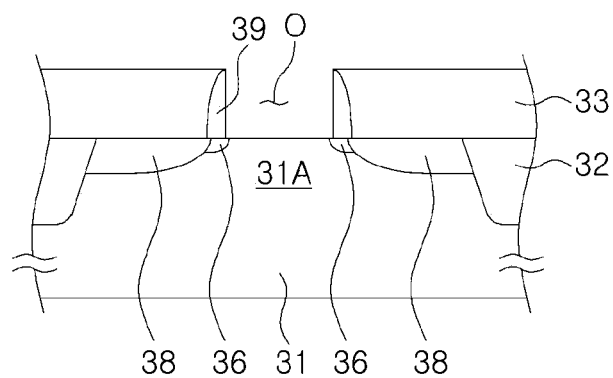

Subsequently, referring to FIG. 2E, a trench O may be formed by removing a dummy gate structure DG.

The active region 31A may be exposed by the trench O formed in this process. In a subsequent process, the gate structure GS may be formed in the active region 31A exposed by the trench O (see FIGS. 2F and 2G). The dummy gate structure DG may be removed by wet etching or dry etching. The mold insulating film 33 and the sidewall spacer 39 may be used as an etching mask when the dummy gate structure DG is removed.

Figure 2F:
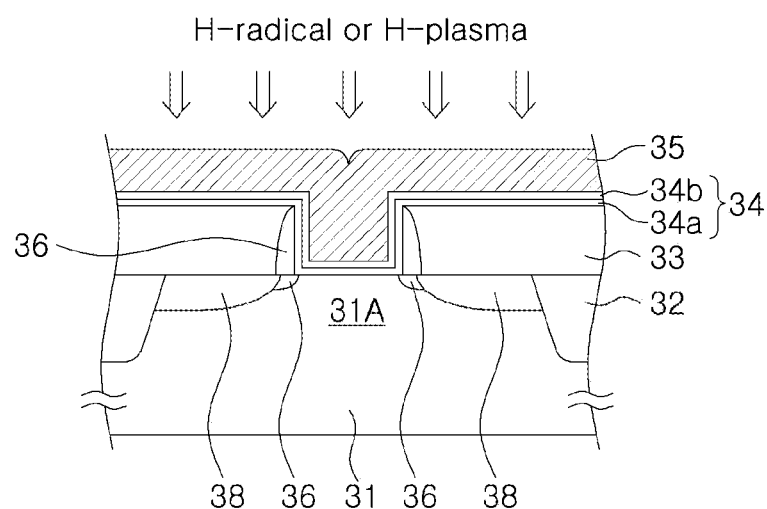

Next, referring to FIG. 2F, a gate insulating film 34 and a gate electrode 35 may be sequentially formed on the semiconductor substrate 31 to form a gate stack 34 and 35 (see gate stack GS in FIG. 2G), and a reduction treatment using hydrogen radicals may be applied to the gate stack.

The gate insulating film 34 employed in the present example embodiment may include a plurality of dielectric layers. As shown in FIG. 2F, the gate insulating film 34 may include a first dielectric film 34a having a first dielectric constant, and a second dielectric film 34b disposed on the first dielectric film 34a and having a second dielectric constant, higher than the first dielectric constant 34a.

When the second dielectric film 34b having a high dielectric constant is directly formed on the semiconductor substrate 31, interface characteristics thereof may be poor. For example, dangling bonding and/or charge traps may be increased at the interface between the semiconductor substrate 31 and the second dielectric layer 34b, thereby greatly reducing the reliability of the device. To alleviate this problem, the first dielectric film 34a may be introduced between the second dielectric film 34b and the semiconductor substrate 31. For example, the first dielectric film 34a may have a thickness of 3 to 30 Å, and the second dielectric film 34b may have a thickness of 3 to 40 Å.

For example, the first dielectric film 34a includes a low dielectric material such as silicon oxide and/or silicon oxynitride, and the second dielectric film 34b may include a high dielectric material such as aluminum oxide, hafnium oxide, hafnium silicon oxide, or zirconium oxide. In a specific example, the first dielectric film 34a may include silicon oxide, and the second dielectric layer 34b may include hafnium oxide.

The gate electrode 35 may be formed on the gate insulating film 34 in a subsequent process. For example, the gate electrode 35 may include metal such as copper (Cu), titanium (Ti), tantalum (Ta), ruthenium (Ru), tungsten (W), cobalt (Co), nickel (Ni), aluminum (Al), metals such as hafnium (Hf), zirconium (Zr), palladium (Pd), platinum (Pt), and molybdenum (Mo), or silicides such as WSi, and nitrides or oxynitrides such as TiN, TaN, TiON, TaON.

A curing process of the gate insulating film 34 may be performed by a reduction treatment using hydrogen radicals (or hydrogen plasma). In this reduction process, the quality of the gate insulating film 34 may be greatly improved by curing to fill the oxygen vacancy present in the gate insulating film 34. The reduction treatment using hydrogen radicals can be performed even at a temperature lower than the normal annealing temperature. The reduction treatment according to the present example embodiment is not limited thereto, but may be performed at 600° C. or lower, for example, and in a specific example embodiment, may be performed at 400° C. to 600° C.

Figure 2G:
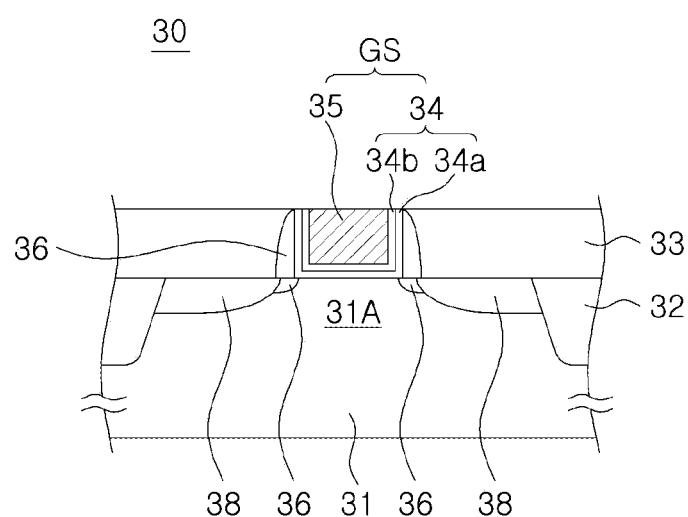

Subsequently, referring to FIG. 2G, a portion of the gate electrode 35 located on the mold insulating film 33 may be removed.

This removal process can be performed by a chemical mechanical polishing (CMP) or an etchback process. In the present process, a portion of the gate insulating film 34 and a portion of the gate electrode 35 positioned on the mold insulating film 33 may be removed, and a final gate electrode 35 may be disposed in a trench region.

As described above, in the semiconductor device 30 such as a MOS transistor, the quality of the gate insulating film can be improved by using a reduction treatment using hydrogen radicals. As a result, the MOS transistor can have excellent electrical characteristics by greatly improving device reliability items such as NBTI related to dielectric defects and reducing gate leakage currents.

Figure 3:
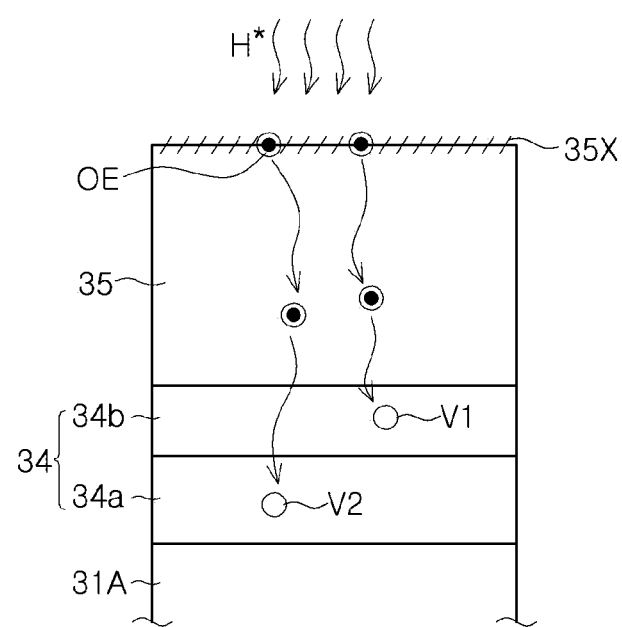
FIG. 3 is a schematic diagram for illustrating a principle of improvement of a gate insulating film through performing a reduction treatment according to inventive concepts.

FIG. 3 is a schematic diagram illustrating the principle of improvement of a gate insulating film by reduction treatment according to inventive concepts.

Referring to FIG. 3, in a process of reduction treatment using hydrogen radicals, hydrogen radicals may react with a natural oxide film 35X (also referred to as native oxide film 35X) on a surface of the gate electrode 35. Through such a strong reduction reaction, highly active oxygen atoms (OE) may be generated and inter-diffusion may be performed in a downward direction. The oxygen atoms OE diffused into the gate insulating film 34 may cure defects such as oxygen vacancies V1 and V2. In particular, the defect V2 of the first dielectric film 34a such as $SiO_2$ may be cured. As a result, the quality of the gate insulating film 34, particularly the first dielectric film 34a, can be improved, thereby improving NBTI and leakage current characteristics related to the defects V1 and V2.

Figure 4A:
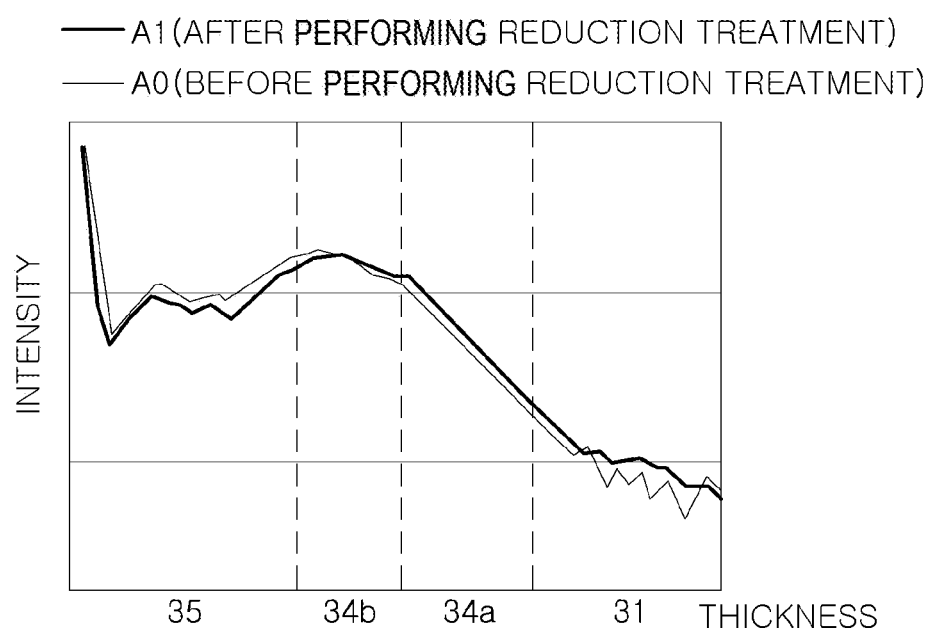
FIGS. 4A to 4B are graphs illustrating a result of secondary ion mass spectroscopy (SIMS) of the gate insulating film subjected to a reduction treatment according to inventive concepts.
Figure 4B:
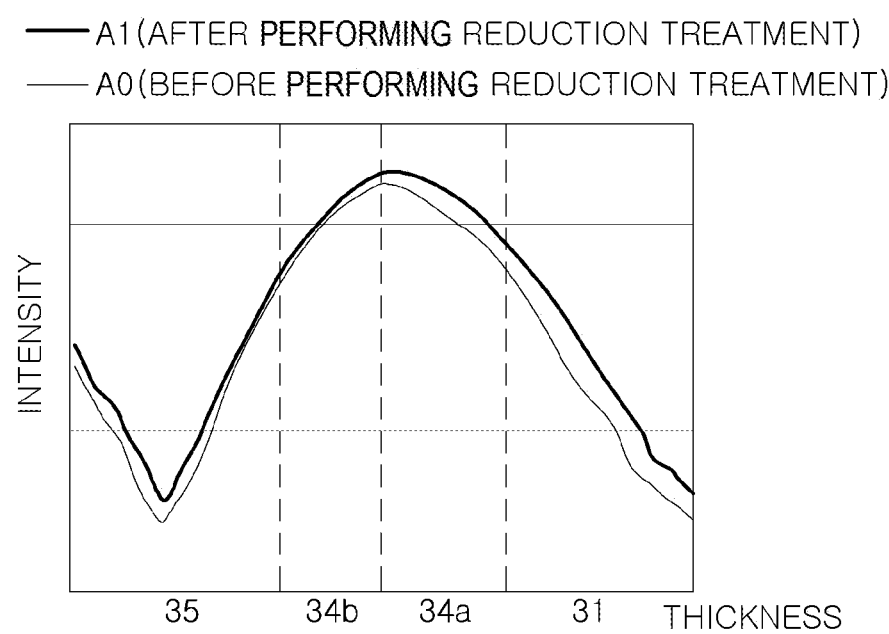

FIGS. 4A and 4B are graphs showing a result of a SIMS (Secondary Ion Mass Spectroscopy) measurement of a gate insulating layer subjected to a reduction treatment according to inventive concepts.

This is a result of measuring the hydrogen content and the oxygen content according to the thickness direction, in each of a gate structure A0 before the reduction treatment and a gate structure A1 subjected to reduction treatment by supplying hydrogen radicals (H*) at about 550° C. That is, FIG. 4A shows the hydrogen content hardly changes after performing the reduction treatment, even in the cured first dielectric film 34a and second dielectric film 34b.

On the other hand, referring to FIG. 4B, there is almost no change in the oxygen content in the gate insulating films 34a and 34b, but the oxygen content in the gate insulating film increases significantly after being subjected to the reduction treatment, particularly the first dielectric film 34a of gate structure A1. The fact that the oxygen content increase in the first dielectric film 34a is greater than that of the second dielectric film 34b may be because a curing action caused by the high active oxygen (OE) occurs more in the first dielectric film 34a such as $SiO_2$ than in the second dielectric film 34b such as HfO.

As described above, it can be understood that the hydrogen radicals (H*) do not penetrate the gate electrode 35 or the gate insulating film 34, but the high active oxygen (OE) generated by the reduction action of the hydrogen radicals (H*) is diffused into the gate insulating film 34 to cure a trap, and the curing is more actively generated in the first dielectric film 34a having an interface with the semiconductor substrate 31.

In example embodiments described above, a case in which the highly active oxygen atom is formed from a natural oxide film that is not intentionally formed has been described as an example, but in some example embodiments, an additional capping layer may also be formed on the gate electrode.

In order to confirm the action and effect of the reduction treatment process according to inventive concepts, reliability and leakage current characteristics were measured by comparing the gate insulating film subjected to reduction treatment under various temperature conditions with the gate insulating film to which the conventional annealing process was applied.

A plurality of gate structures were prepared by sequentially stacking a $SiO_2$/HfO gate insulating film and a TiN gate electrode on a silicon substrate, and a process of improving the reliability of the gate insulating film was applied to each of them under different temperature conditions.

Specifically, the conventional annealing process was performed at 450° C., 550° C., and 900° C. (Comparative Examples 1 to 3, respectively), and the reduction treatment using a hydrogen radical flow according to the present example embodiment was performed at 450° C. and 550° C. (Inventive Examples 1 and 2, respectively). The result of the application, that is, the NBTI characteristic of the gate insulating film was measured, and the reliability improvement effect was expressed as a multiple of the NBTI characteristic before the application of the reliability improvement process of the gate insulating film, and was shown in the graph of FIG. 5A.

Figure 5A:
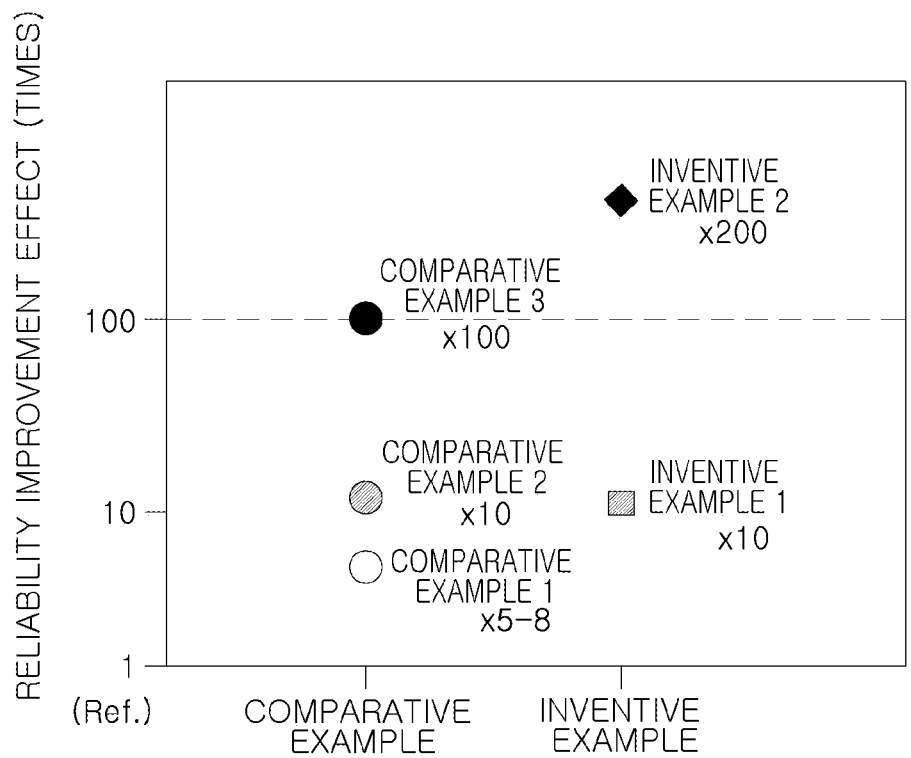
FIGS. 5A to 5B are graphs illustrating a result of evaluating reliability (NBTI) and leakage current characteristics of the gate insulating film of Examples and Comparative Examples of inventive concepts.

Referring to FIG. 5A, in the case of Comparative Example 1 (450° C., annealing) and Comparative Example 2 (550° C., annealing), it was found that the improvement effect is only 5 to 8 times and 10 times, and in the case of an annealing process, it has a sufficient improvement effect of 100 times or more when performed at a temperature of at least 900° C. (Comparative Example 3). On the other hand, in the case of the reduction treatment using hydrogen radicals, in the case of Inventive Example 1 (450° C., hydrogen radical reduction treatment), similar to Comparative Example 2 (550° C., annealing), an improvement effect of 10 times was exhibited, and in the case of Inventive Example 2 (550° C., hydrogen radical reduction treatment), and an improvement effect of 200 times was exhibited much higher than Comparative Example 3 (900° C., annealing).

As described above, it was confirmed that the reduction treatment using hydrogen radicals can significantly improve the NBTI reliability even at a relatively low temperature compared to the conventional annealing process.

Figure 5B:
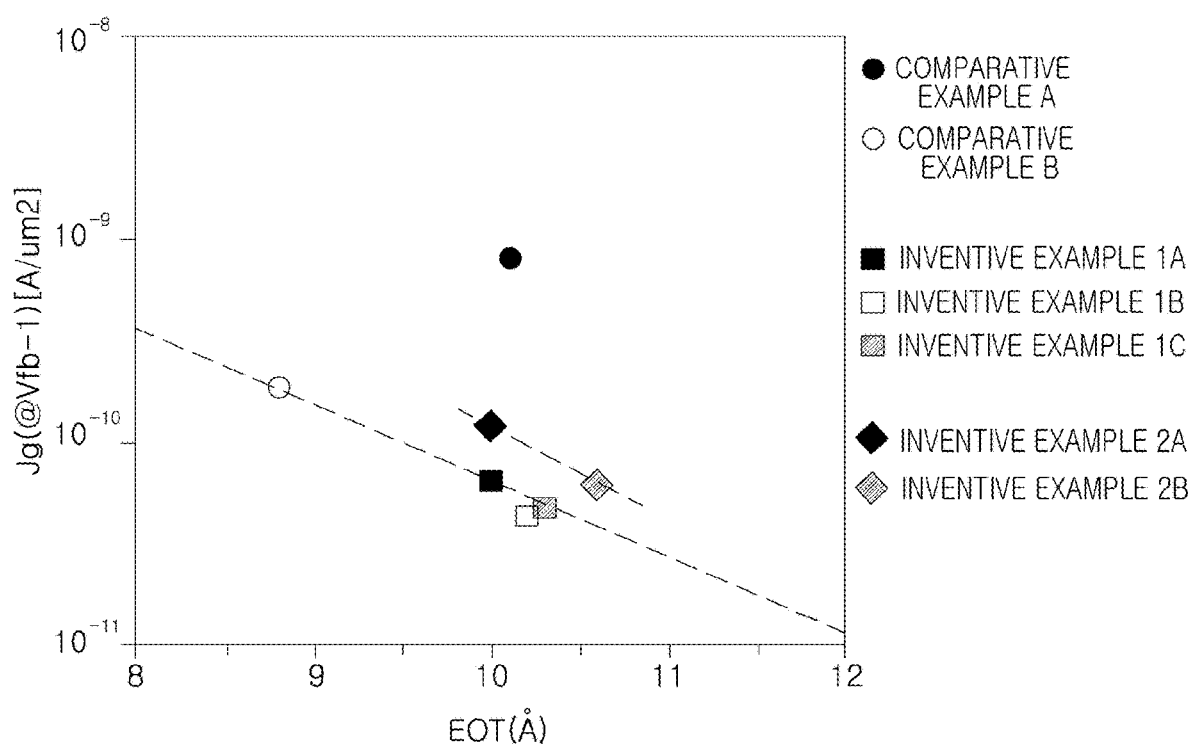

Additionally, the leakage current (Jg) and effective thickness (EOT) of the gate insulating film were evaluated and shown in FIG. 5B.

Referring to FIG. 5B, it was found that the leakage current is relatively large in the case of Comparative Example A (900° C., annealing). On the other hand, in the case of Inventive Examples 1A to 1C (450° C., hydrogen radical reduction treatment) and Inventive Examples 2A and 2B (550° C., hydrogen radical reduction treatment), it was found that the leakage current decreased about 95% and 85% compared to Comparative Example A.

Meanwhile, in the case of Comparative Example B (450° C., annealing), while the effective thickness of the gate insulating film was relatively thin, in the case of Inventive Examples 1A to 1C (450° C., hydrogen radical reduction treatment) and Inventive Examples 2A and 2B (550° C., hydrogen radical reduction treatment), it was found that the effective thickness of the gate insulating film is greater than or equal to 10 Å.

As described above, it can be confirmed that the hydrogen radical reduction treatment according to the present example embodiment may improve the leakage current and/or effective thickness characteristics as well as the NBTI reliability compared to the annealing process under the same temperature conditions.

The dielectric film employed in the previous example embodiments is illustrated in a form used as a gate insulating film, but inventive concepts are not limited thereto, and it can also be beneficially applied by a method of forming a dielectric film for various elements (e.g., an interlayer insulating film, a capacitor material) of a semiconductor device.

FIGS. 6A to 6D are cross-sectional views for operations in a method of manufacturing a semiconductor device according to an example embodiment of inventive concepts.

Figure 6A:
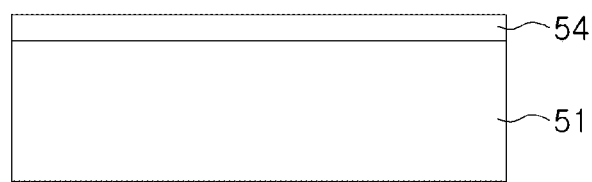
FIGS. 6A to 6D are cross-sectional views for operations in a method of manufacturing a semiconductor device according to an example embodiment of inventive concepts.

First, referring to FIG. 6A, a dielectric film 54 may be formed on a semiconductor substrate 51.

The semiconductor substrate 51 may include a silicon substrate, a germanium substrate, a silicon-germanium substrate, a silicon-on-insulator (SOI) substrate, or a germanium-on-insulator (GOI) substrate. The dielectric film 54 may be formed by a chemical vapor deposition process (CVD), a physical vapor deposition process (PVD), an atomic layer deposition process (ALD), or the like. As described above, the dielectric layer 22 (and/or dielectric film 54) may include a high dielectric material having a high dielectric constant (e.g., 10 or more) as well as silicon oxide ($SiO_2$), silicon nitride ($SiN_x$), or silicon oxynitride (SiON).

Figure 6B:
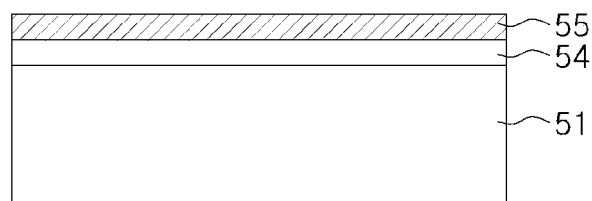

Subsequently, referring to FIG. 6B, a conductive layer 55 may be formed on the dielectric film 54.

The conductive layer 55 may be various types of electrodes or wiring layers. In some example embodiments, the conductive layer 55 may be disposed in some regions of the dielectric film 54. The dielectric film 54 may be formed by a chemical vapor deposition process (CVD), a physical vapor deposition process (PVD), an atomic layer deposition process (ALD), or the like. The conductive layer 55 may include metal such as copper (Cu), titanium (Ti), tantalum (Ta), ruthenium (Ru), tungsten (W), cobalt (Co), nickel (Ni), aluminum (Al), hafnium (Hf), zirconium (Zr), palladium (Pd), platinum (Pt), and molybdenum (Mo).

Figure 6C:
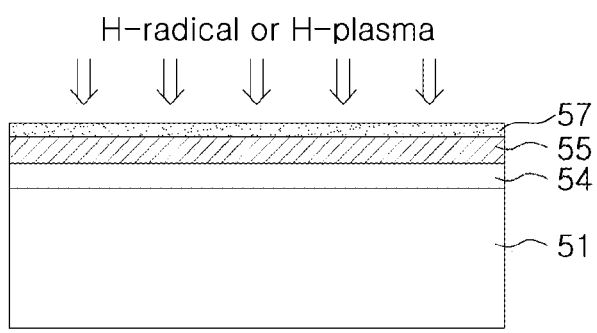

Next, referring to FIG. 6C, a capping layer 57 may be formed on the conductive layer 55, and then the dielectric layer 54 may be subjected to a reduction treatment using hydrogen radicals or hydrogen plasma.

Before the reduction treatment, a capping layer 57 may be additionally formed on the conductive layer 55. For example, the capping layer 57 may include a semiconductor layer such as silicon (Si) or an oxide layer such as $SiO_2$. The capping layer 57 may be provided as a surface layer generating highly active oxygen curing the trap of the dielectric layer 54 through a reduction action by replacing the natural oxide layer of the previous example embodiment.

A reduction treatment is performed on the stacks 54, 55, and 57 thus formed using hydrogen radicals or hydrogen plasma. In this reduction treatment process, the oxygen vacancy present in the dielectric layer 54 may be cured, so that the reliability and electrical characteristics of the dielectric layer 54 can be greatly improved. In some example embodiments, since the reduction treatment using hydrogen radicals may be performed at a temperature lower than a typical annealing temperature (e.g., 900° C.), as described above, the treatment may be beneficially used in an environment requiring a low-temperature process (e.g., 600° C. or lower).

Figure 6D:
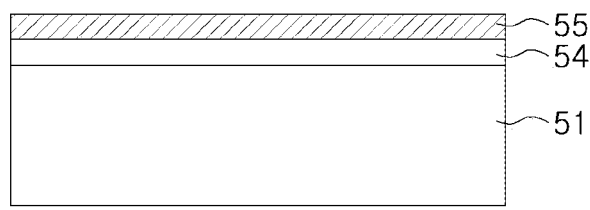

Subsequently, referring to FIG. 6D, the capping layer 57 may be removed from the conductive layer 55.

The capping layer 57 may be performed by dry or wet etching using an etchant having a high selectivity with the conductive layer 55. In some example embodiments, when the capping layer 57 has a region in contact with the dielectric layer 54, it may be removed using an appropriate etching process ensuring selectivity with the dielectric film 54.

In another example embodiment, the capping layer 57 may not be removed and may remain in a final structure. For example, when the capping layer 57 is an insulating material, an insulating portion may be formed together with an additional insulating layer (not shown) formed thereon.

Figure 7A:
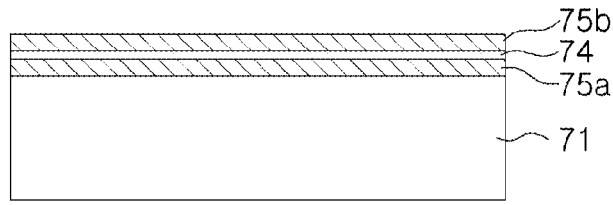
FIGS. 7A to 7C are cross-sectional views for operations in a method of manufacturing a semiconductor device according to an example embodiment of inventive concepts.
Figure 7B:
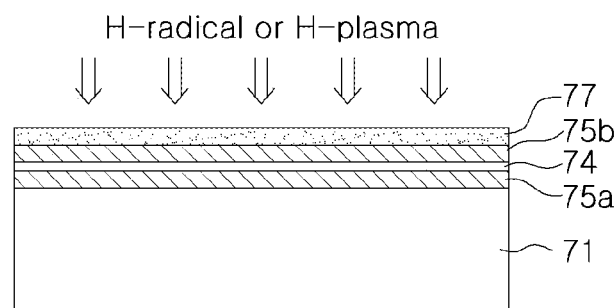
Figure 7C:
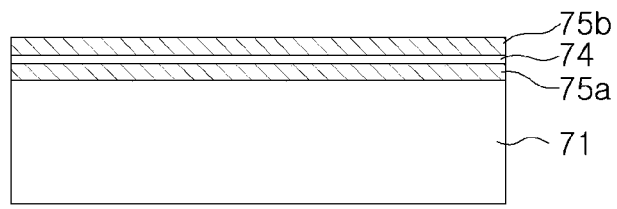

FIGS. 7A to 7C are cross-sectional views for operations in a method of manufacturing a semiconductor device according to an example embodiment of inventive concepts. The present example embodiment can be understood as a method of manufacturing a MIM capacitor having a thin dielectric film.

First, referring to FIG. 7A, a first metal layer 75b, a dielectric film 74, and a second metal layer 75a may be sequentially formed on a semiconductor substrate 71.

The first metal layer 75b, the dielectric film 74, and the second metal layer 75a may constitute a metal-insulator-metal (MIM) capacitor structure, and such a capacitor structure may be formed in a desired specific region of the semiconductor substrate 71. In the present example embodiment, the capacitor structure is illustrated as having a flat structure on a flat upper surface of the semiconductor substrate 71, but is not limited thereto, and may be provided in a three-dimensional structure on a non-flat surface such as a trench structure.

The first and second metal layers 75a and 75b may include metal such as copper (Cu), titanium (Ti), tantalum (Ta), ruthenium (Ru), tungsten (W), cobalt (Co), nickel (Ni), aluminum Metals such as (Al), hafnium (Hf), zirconium (Zr), palladium (Pd), platinum (Pt), and molybdenum (Mo). The dielectric film 74 may include various dielectric materials described above, and in some example embodiments, may be formed of two or more dielectric films. For example, as the dielectric film, a high dielectric constant material such as a hafnium oxide film ($HfO_2$), a hafnium silicon oxide film (HfSiO), a hafnium silicon oxynitride film (HfSiON), a hafnium oxynitride film (HfON), a hafnium aluminum oxide film (HfAlO), a hafnium lanthanum oxide film (HfLaO), zirconium oxide ($ZrO_2$), tantalum oxide ($TaO_2$), zirconium silicon oxide (ZrSiO), lanthanum oxide ($La_2O_3$), praseodymium oxide ($Pr_2O_3$), and/or dysprosium oxide ($Dy_2O_3$) may be used.

Next, referring to FIG. 7B, a capping layer 77 may be formed on the second metal layer 75b, and then a reduction treatment may be performed using hydrogen radicals or hydrogen plasma.

Before the reduction treatment, a capping layer 77 may be additionally formed on the dielectric film 74. For example, the capping layer 77 may include a semiconductor layer such as silicon (Si) or an oxide layer such as $SiO_2$. Similar to the previous example embodiment (referring to FIG. 6C), the capping layer 77 may be provided as a surface layer for generating highly active oxygen curing a trap of the dielectric film 74.

Subsequently, the capping layer 77 may be subjected to a reduction treatment using hydrogen radicals or hydrogen plasma. In this reduction treatment process, the oxygen vacancy present in the dielectric film 74 may be cured, so that the reliability and electrical characteristics of the dielectric film 74 may be greatly improved.

Next, referring to FIG. 7C, a capping layer 77 may be removed from the second metal layer 75b.

The capping layer 77 may be performed by dry or wet etching using an etchant having high selectivity with the second metal layer 74b. In another example embodiment, the capping layer 77 may not be removed and may remain in a final structure. For example, when the capping layer 77 is an insulating material, an insulating portion may be formed together with an additional insulating layer (not shown) formed thereon, and when the capping layer 77 is a conductive layer, it may be provided as an upper electrode together with the second metal layer 75b located therebelow.

As described above, the method of forming a dielectric film according to inventive concepts can be used not only as a gate insulating film, but also as other components of a semiconductor device. For example, it may be used as an insulating film having improved leakage current characteristics in various semiconductor devices, or may be used as a dielectric film of a MIM capacitor.

Figure 8:
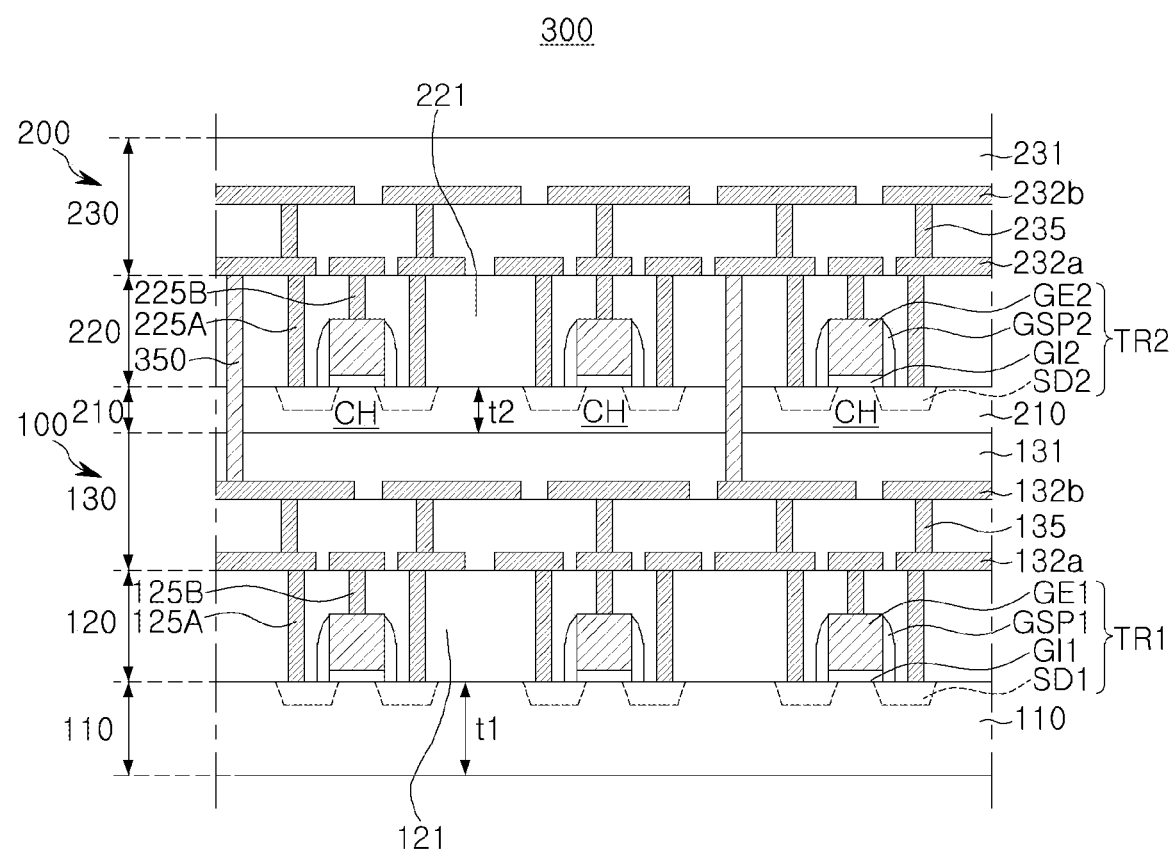
FIG. 8 is a cross-sectional view illustrating a semiconductor device according to an example embodiment of inventive concepts.

FIG. 8 is a cross-sectional view illustrating a semiconductor device according to an example embodiment of inventive concepts.

Referring to FIG. 8, a three-dimensional semiconductor device 300 according to the present example embodiment may include a first device layer 100 and a second device layer 200 disposed on the first device layer 100.

The first device layer 100 may include a first substrate 110 and first transistors TR1 disposed on the first substrate 110. The first substrate 110 may be the above-described semiconductor substrate. The first transistors TR1 may be disposed on the first substrate 110 to configure a desired electronic circuit. For example, the first transistors TR1 may constitute a memory circuit (e.g., a DRAM circuit, an SRAM circuit, or a FLASH memory circuit) or a logic circuit. The logic circuit may include a circuit such as an inverter, an AND gate, an OR gate, a NAND gate or a NOR gate, and/or a circuit such as FLIP-FLOP.

Each of the first transistors TR1 may include a first gate electrode GE1 disposed on the first substrate 110, a first gate insulating film GI1 disposed between the first substrate 110 and the first gate electrode GE1, and a first gate spacer GSP1 disposed on both side surfaces of the first gate electrode GE1, opposite to each other. The first substrate 110 located on both sides of the first gate electrode GE1 may include first source/drain regions SD1.

The first gate electrode GE1 may include at least one of a doped semiconductor, a conductive metal nitride, or metal. For example, the doped semiconductor may include at least one of polycrystalline silicon (Si) doped with impurities, polycrystalline silicon germanium (SiGe), or polycrystalline germanium (Ge). For example, the conductive metal nitride or metal may include Ti, TiN, TION, W, WSi, WN, Ta, TaN, TaON, La, Al, or TiAlC.

The first gate insulating film GI1 may include at least one of silicon oxide, silicon nitride, silicon oxynitride, and a high dielectric material, and may include two or more dielectric films. Similar to the previous example embodiment (referring to FIG. 2G), the first gate insulating film GI1 may include a first dielectric film having a first dielectric constant, and a second dielectric film disposed on the first dielectric film and having a second dielectric constant, greater than the first dielectric constant. For example, the first dielectric film may include a low dielectric constant material such as silicon oxide and/or silicon oxynitride, and the second dielectric layer may include a high dielectric constant material such as aluminum oxide, hafnium oxide, hafnium silicon oxide, or zirconium oxide. In a specific example, the first dielectric film may include silicon oxide, and the second dielectric layer may include hafnium oxide. In addition, the first gate spacer GSP1 may include at least one of silicon oxide, silicon nitride, and silicon oxynitride.

The first source/drain regions SD1 may be impurity regions doped with p-type or n-type impurities on the first substrate 110, or may include an epitaxial layer regrown in a partial region of the first substrate 110 (mainly, a region in which a recess is formed). In this case, the first source/drain regions SD1 may include at least one of impurity-doped silicon germanium (SiGe), silicon (Si), or silicon carbide (SiC).

The first device layer 120 may include a first interlayer insulating film 121 covering the first transistors TR1. The first interlayer insulating film 121 may include at least one of silicon oxide, silicon nitride, silicon oxynitride, or a low dielectric material.

The first device layer 120 may include a first source/drain contact 125A penetrating the first interlayer insulating film 121 and respectively connected to the first source/drain regions SD1, and a first gate contact 125B penetrating through the first interlayer insulating film 121 and respectively connected to the first gate electrode GE1. For example, the first source/drain contact 125A and the gate contact 125B may include metal nitrides such as TiN, WN, and TaN, and/or metals such as Ti, W, and Ta.

The first device layer 100 includes a first wiring portion 130 disposed on the first interlayer insulating film 121. The first wiring portion 130 may be a back end of the lines (BEOL) for the first device layer 120. The first wiring portion 130 includes a first low dielectric layer 131 disposed on the first interlayer insulating film 121, and a first conductive line disposed on the first low dielectric layer 131 and connected to the first source/drain contact 125A and the gate contact 125B. The first conductive line may include a plurality of lines located on different levels and via(s) connecting the plurality of lines. As shown in FIG. 8, the first conductive line may include a first lower line 132a disposed on the first interlayer insulating film 121, a first upper line 132b disposed at a higher level than the first lower line 132a, and a via 135 connecting the first lower line 132a and the first upper line 132b.

As described above, the first transistors TR1 may be connected to conductive lines 135a and 135b of the first wiring portion 130 through the first source/drain contact 125A and the first gate contact 125B.

For example, the first low dielectric layer 131 may include a low-k dielectric material such as silicon oxide, silicon nitride, and silicon oxynitride. For example, the first lower lines 132a, the first upper lines 132b, and the via 135 may include copper (Cu), ruthenium (Ru), molybdenum (Mo), tungsten (W), cobalt (Co) and/or conductive metal compounds such as titanium nitride (TiN), tantalum nitride (TaN), tantalum carbide (TaC), and tungsten cyanide (WCN).

The second device layer 200 may be stacked on the first device layer 100. The second device layer 200 may include a second substrate 210 disposed on the first device layer 100, particularly on the first low dielectric layer 131 of the first wiring portion 130, and second transistors TR2 disposed on the second substrate 210. The thickness t2 of the second substrate 210 may be smaller than the thickness t1 of the first substrate 110. The second substrate 210 may be polished to a desired and/or alternatively predetermined thickness t2 after being bonded to the first low dielectric layer 131. For example, the second substrate 210 may have a thickness t2 at which a channel layer CH on which the second transistors TR2 are positioned may be provided. In a specific example, the thickness t2 of the second substrate 210 may be about 2 μm or less.

Similar to the first transistors TR1, each of the second transistors TR2 may include a first gate electrode GE1 disposed on the second substrate 210, a second gate insulating film GI2 disposed between the second substrate 210 and the second gate electrode GE2, and a second gate spacer GSP2 disposed on both side surfaces of the first gate electrode GE1 opposite to each other. The second substrate 210 disposed on both sides of the second gate electrode GE2 may include second source/drain regions SD2.

For example, similar to the first gate electrode GE1, the second gate electrode GE2 may include at least one of a doped semiconductor, a conductive metal nitride, or metal. Similar to the first gate insulating film GI1, the second gate insulating film GI2 may include at least one of silicon oxide, silicon nitride, silicon oxynitride, and a high-k dielectric material, and may include two or more dielectric films.

Reliability of the first and second gate insulating films GI1 and GI2 may be improved through different processes. Since the process temperature of forming the first device layer 100 is not relatively limited, the first gate insulating film GI1 may be processed by a relatively high temperature annealing process. On the other hand, in the formation of the second device layer 200, since the process temperature is limited to limit and/or prevent damages to the first transistors TR1 and the first wiring portion 130, the quality of the second gate insulating film GI2 may be improved by the reduction treatment using hydrogen radicals at low temperatures.

As described above, due to the difference in the process temperature of the first and second gate insulating films GI1 and GI2, the hydrogen content of the second gate insulating film GI2 may be higher than the hydrogen content of the first gate insulating film GI1. For example, the hydrogen content of the second gate insulating film GI2 may be 10% or more greater than the hydrogen content of the first gate insulating film GI1. In certain instances, this difference in hydrogen content may be 15% or more.

Even when the first gate insulating film GI1 and the second gate insulating film GI2 include the same material layer (especially, the same oxide layer), the above-described difference in hydrogen content may occur. In some example embodiments, the first and second gate insulating films GI1 and GI2 may include a first dielectric film having a first dielectric film having the same first dielectric constant and a second dielectric film disposed on the first dielectric film and having a second dielectric constant, higher than the first dielectric constant. Even in this case, in the case of the second dielectric film as well as the first dielectric film, the hydrogen content of the second gate insulating film GI2 may be large. This will be described in detail with reference to FIG. 10.

Similar to the first source/drain regions SD1, the second source/drain regions SD2 may be impurity regions doped with p-type or n-type impurities in the second substrate 210, or include an epitaxial layer regrown in a partial region of the second substrate 210 (mainly, a region in which a recess is formed). The second device layer 220 may include a second interlayer insulating film 221 covering the second transistors TR2.

The second device layer 220 may include a second source/drain contact 225A penetrating through the second interlayer insulating film 221 and respectively connected to the second source/drain regions SD2, and a gate contact 225B penetrating through the second interlayer insulating layer 221 and respectively connected to the second gate electrode GE2. The second device layer 200 includes a second wiring portion 230 disposed on a second interlayer insulating layer 221. The second wiring portion 230 may be a back end of the lines (BEOL) for the second device layer 220. The second wiring portion 230 includes a second low dielectric layer 231 disposed on the second interlayer insulating film 221, and a second conductive line disposed on the second low dielectric layer 231 and connected to the second source/drain contact 225A and the second gate contact 225B. The second conductive line may include a second lower line 232a disposed on the second interlayer insulating layer 221, a second upper line 232b disposed at a higher level than the second lower line 232a, and a via 235 connecting the second lower line 232a and the second upper line 232b.

As described above, the second transistors TR2 may be connected to the conductive lines 235a and 235b of the second wiring portion 230 through the second source/drain contact 225A and the second gate contact 225B.

The three-dimensional semiconductor device 300 according to the present example embodiment may further include a through-via 350 electrically connecting a first device layer 100 to a second device layer 200. Specifically, the through-via 350 may penetrate through the second substrate 210 and connect the plurality of first conductive lines 132a and 132b to the plurality of second conductive lines 232a and 232b. For example, the through-via 350 may include a metal nitride such as TiN, WN, and TaN, and/or metal such as Ti, W, and Ta.

FIGS. 9A to 9E are cross-sectional views for operations in a method of manufacturing a semiconductor device according to an example embodiment of inventive concepts.

Figure 9A:
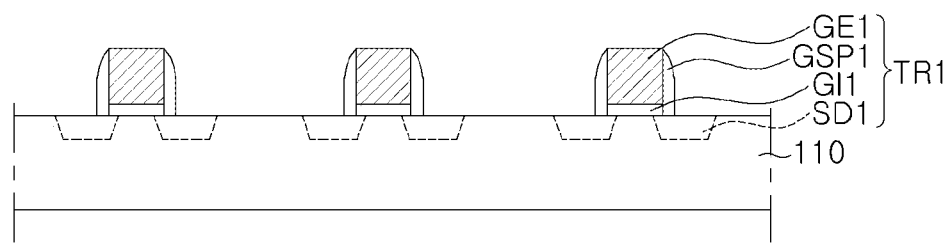
FIGS. 9A to 9E are cross-sectional views for operations in a method of manufacturing a semiconductor device according to an example embodiment of inventive concepts.

Referring to FIG. 9A, a plurality of first transistors TR1 disposed on the first substrate 110 may be formed.

The process of forming the first transistor TR1 may be described with reference to the processes of FIGS. 1A to 1E and the processes of FIGS. 2A to 2G except for a hydrogen radical reduction process. After forming the first gate insulating film GI1 on the first substrate 110 or after forming the first gate electrode GE1, an annealing process for the first gate insulating film GI1 may be performed. Such annealing may be performed at a relatively high temperature compared to the reduction treatment process using hydrogen radicals. Such annealing may be performed, for example, at 550° C. or higher, and in some example embodiments, may be performed at 900° C. In addition, the annealing process may be performed by an electric furnace, rapid annealing (RTA), rapid heat treatment (RTP), flash lamp annealing, laser annealing, or the like. In some example embodiments, in this annealing process, a curing process may be performed in a manner that a separate curing layer is disposed on the first gate insulating film GI1 or the first gate electrode GE1, and some elements are diffused in the first gate insulating film GI1.

Figure 9B:
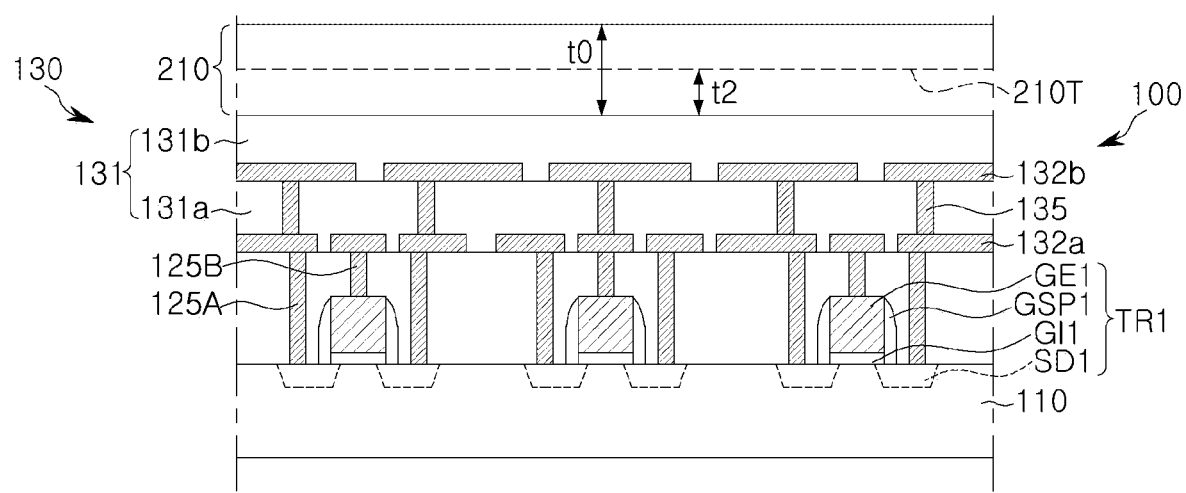

Subsequently, referring to FIG. 9B, a first wiring portion 130 may be formed on the plurality of first transistors TR1, and a second substrate 210 may be formed on the first wiring portion 130.

The first wiring portion 130 may include a first low dielectric layer 131 disposed on the first interlayer insulating film 121, and a plurality of first conductive lines 132a and 132b disposed on the first low dielectric layer 131 and connected to the first source/drain contact 125A and the gate contact 125B. A second substrate 210 having a constant thickness t0 may be bonded to the first low dielectric layer 131, and then, the second substrate 210 may be polished to a sufficient thickness t2 to provide a channel layer CH on which the second transistors TR2 are located. The polished surface 210T of the second substrate 210 may be provided as a formation region of the second transistor. In the case of having a monolithic three-dimensional structure as in the present example embodiment, the second substrate 210 may have a thickness t2. For example, the thickness t2 of the second substrate 210 may be about 2 μm or less.

Figure 9C:
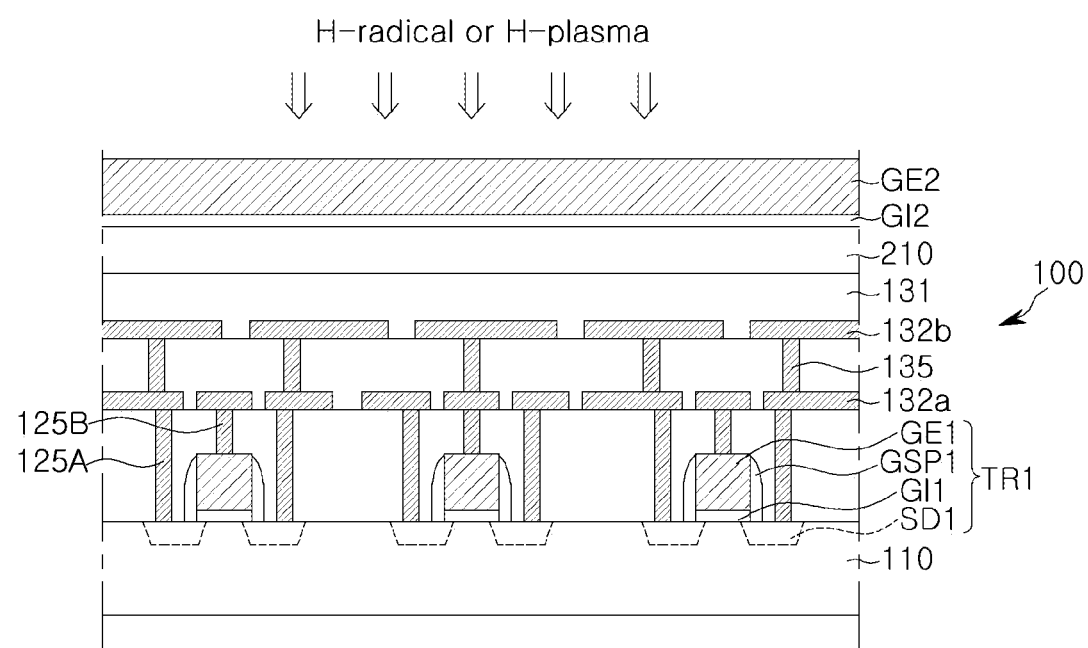

Next, referring to FIG. 9C, a gate stack including a second gate insulating film GI2 and a second gate electrode GE2 may be formed on the first substrate 210, and the gate stack can be subjected to a reduction treatment using hydrogen radicals and hydrogen plasma.

This process may be described with reference to the processes of FIGS. 1A to 1C and the processes of FIGS. 2A to 2F. In the present example embodiment, the second gate insulating film GI2 may be formed of the same material and the same structure as the first gate insulating film GI1. For example, the first and second gate insulating films GI1 and GI2 may be $SiO_2$/HfO. Subsequently, a reduction treatment process using hydrogen radicals or hydrogen plasma may be applied to the second gate insulating film GI2.

In this reduction process, the quality of the second gate insulating film GI2 may be greatly improved by curing to fill an oxygen vacancy present in the second gate insulating film GI2. The reduction treatment using hydrogen radicals may be performed even at a temperature lower than the annealing temperature for the first gate insulating film GI1. The reduction treatment according to the present example embodiment is not limited thereto, but, for example, may be performed at 600° C. or lower.

As described above, since the second gate insulating film GI2 can be cured at a relatively low temperature, damages to first transistors TR1 and a first wiring portion 130 (especially, a conductive line such as Cu) located below the second gate insulating film GI2 may be reduced and/or minimized.

Figure 9D:
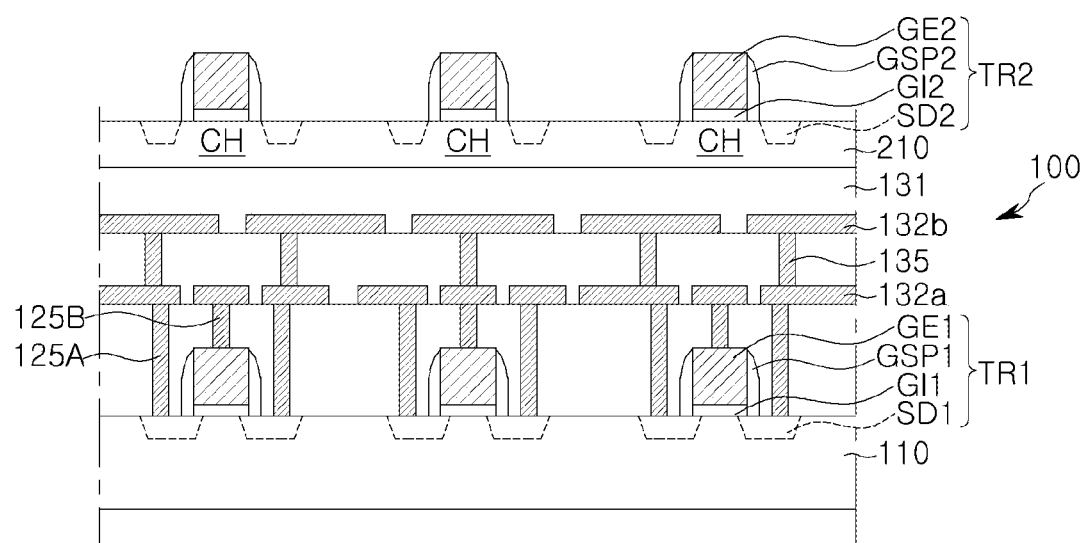
Figure 9E:
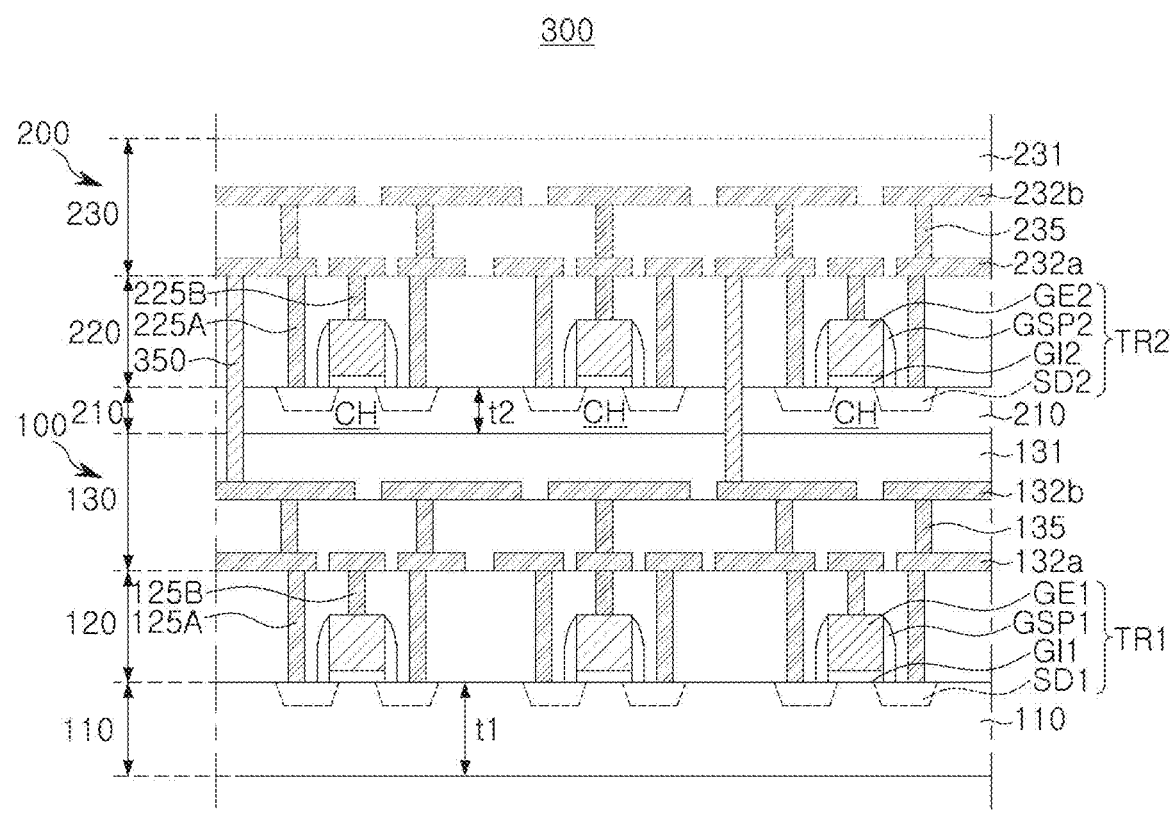

Subsequently, referring to FIG. 9D, a plurality of second transistors TR2 having a second gate insulating film GI2 and a second gate electrode GE2 may be formed on the second substrate 210, and a second wiring portion 230 and a through-via 235 may be formed on the plurality of second transistors TR2.

Figure 10:
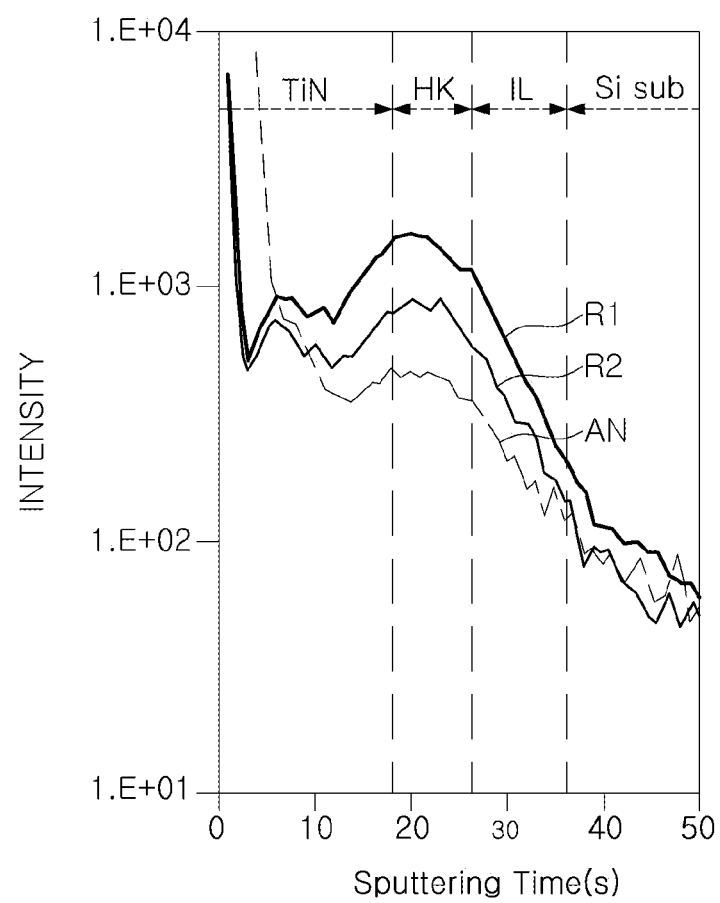
FIG. 10 is a graph illustrating SIMS measurement results of the gate insulating films of the first and second device layers.

In the present example embodiment, since the second gate insulating film GI2 is cured at a lower temperature than the first gate insulating film GI1, the second gate insulating film GI1 may have a higher hydrogen content than the first gate insulating film GI1. FIG. 10 is a graph illustrating the SIMS measurement results of the first and second gate insulating films GI1 and GI2.

Referring to FIG. 10, each of the first and second gate insulating films GI1 and GI2 includes an interface layer IL and a high-k dielectric film HK on a silicon substrate, and specifically includes $SiO_2$/HfO. First and second gate electrodes GE1 and GE2, which are commonly TiN, may be formed on the first and second gate insulating films GI1 and GI2. 900° C. of annealing (AN) was performed for the first gate insulating film GI1, and reduction treatments R1 and R2 using hydrogen radicals were applied for the second gate insulating film at different GI2 at different temperatures (450° C. and 550° C.). It can be understood that when the first and second gate insulating films GI1 and GI2 are formed of the same material layer, the lower the process temperature, the higher the hydrogen content.

Specifically, the hydrogen content of the second gate insulating film GI2 is 10% or more greater than the hydrogen content of the first gate insulating film GI1, and there may be a difference in the hydrogen content of 15% or more according to a temperature variation. This difference in hydrogen contents can be confirmed through a comparison of the relative intensity of SIMS for hydrogen atoms.

Figure 11:
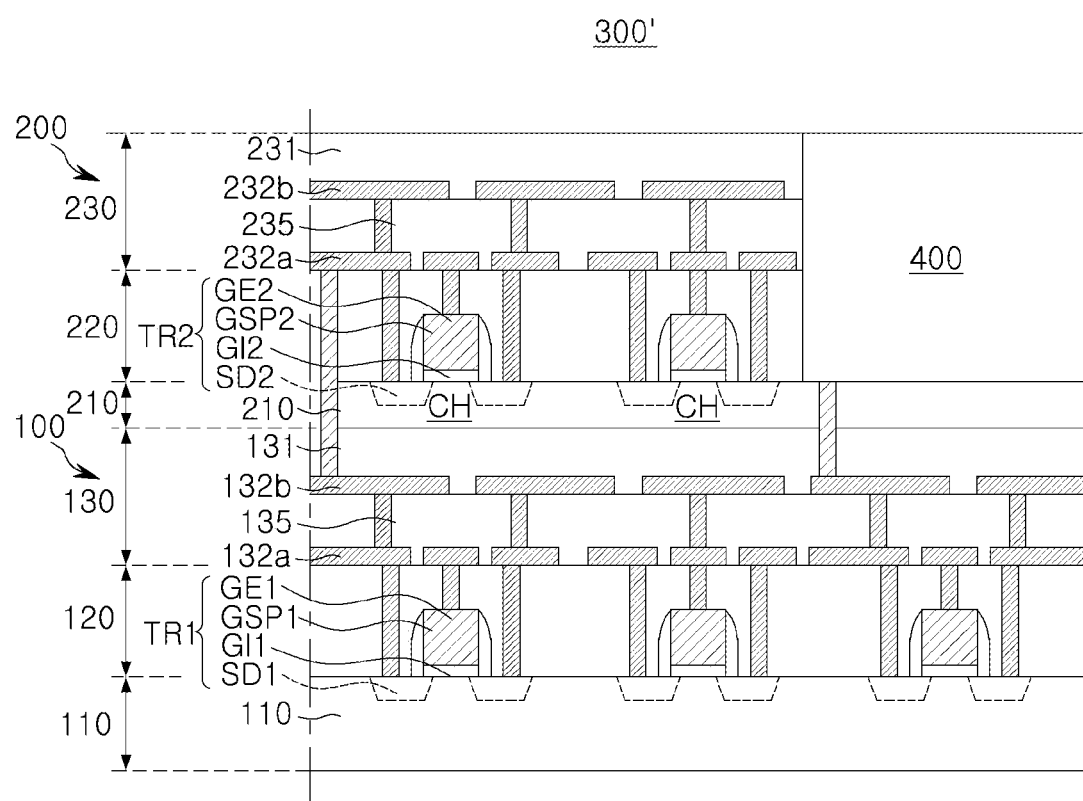
FIG. 11 is a cross-sectional view illustrating a semiconductor device according to an example embodiment of inventive concepts.

FIG. 11 is a cross-sectional view illustrating a three-dimensional semiconductor device according to an example embodiment of inventive concepts.

Referring to FIG. 11, it may be understood as similar to a three-dimensional semiconductor device 300' according to the present example embodiment the three-dimensional semiconductor device 300 shown in FIG. 1 except that a second device layer 200 includes a memory cell 400. In addition, the components of the present example embodiment may be understood with reference to the description of the same or similar components of the three-dimensional semiconductor device 300 illustrated in FIG. 1 unless otherwise specified.

The memory cell array 400 employed in the present example embodiment may be disposed on the second substrate 210. The second device layer 200 may include a memory cell array 400 spaced apart from a region in which the second transistors TR2 are formed and disposed on the second substrate 210. The memory cell array 400 may include one of a NAND flash memory, a DRAM memory, and a variable resistance memory. For example, the memory cell array 400 may include the DRAM shown in FIGS. 12 and 13E or the VNAND flash memory shown in FIG. 14.

The method for improving the reliability of the gate insulating film applied to the above-described example embodiments may be advantageously employed in semiconductor memory devices such as DRAM and nonvolatile memory. Hereinafter, as another application example, various example embodiments of a method of manufacturing a semiconductor memory device, to which a reduction treatment process using hydrogen radicals, which is a novel trap reduction technique, is applied, will be described.

Figure 12:
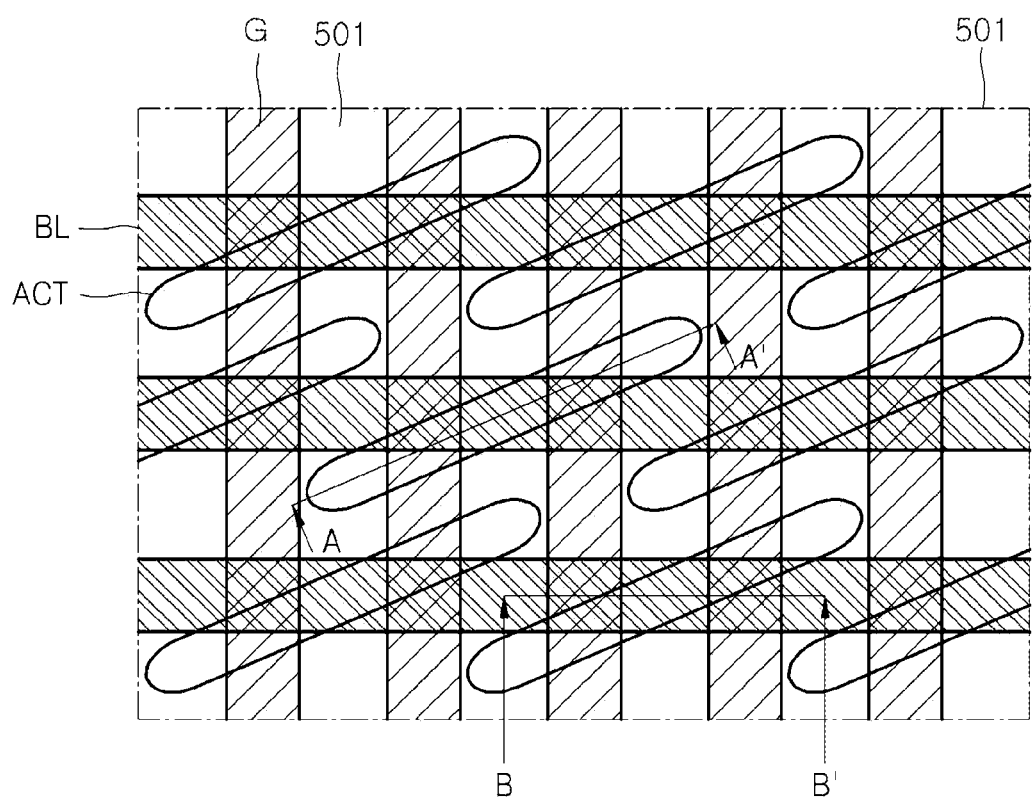
FIG. 12 is a schematic plan view illustrating a layout of a semiconductor device according to an example embodiment of inventive concepts.

FIG. 12 is a schematic plan view illustrating a layout of a semiconductor device according to an example embodiment of inventive concepts, and FIGS. 13A to 13E are cross-sectional views of operations in a method of manufacturing the semiconductor device illustrated in FIG. 12. FIGS. 13A to 13E may be understood as a cross-section taken along line A-A' and a cross-section along line B-B' of FIG. 12.

Figure 13A:
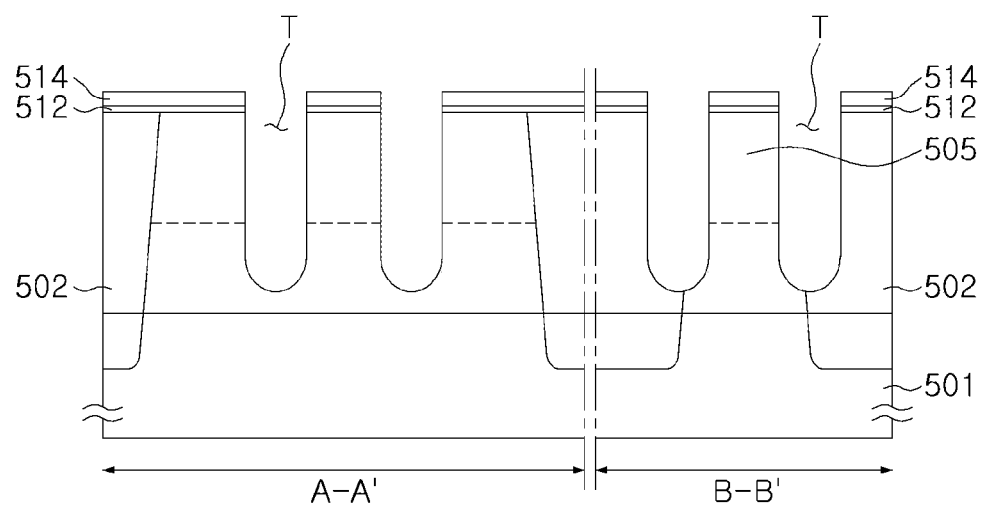
FIGS. 13A to 13E are cross-sectional views of operations in a method of manufacturing the semiconductor device illustrated in FIG. 12.
Figure 13B:
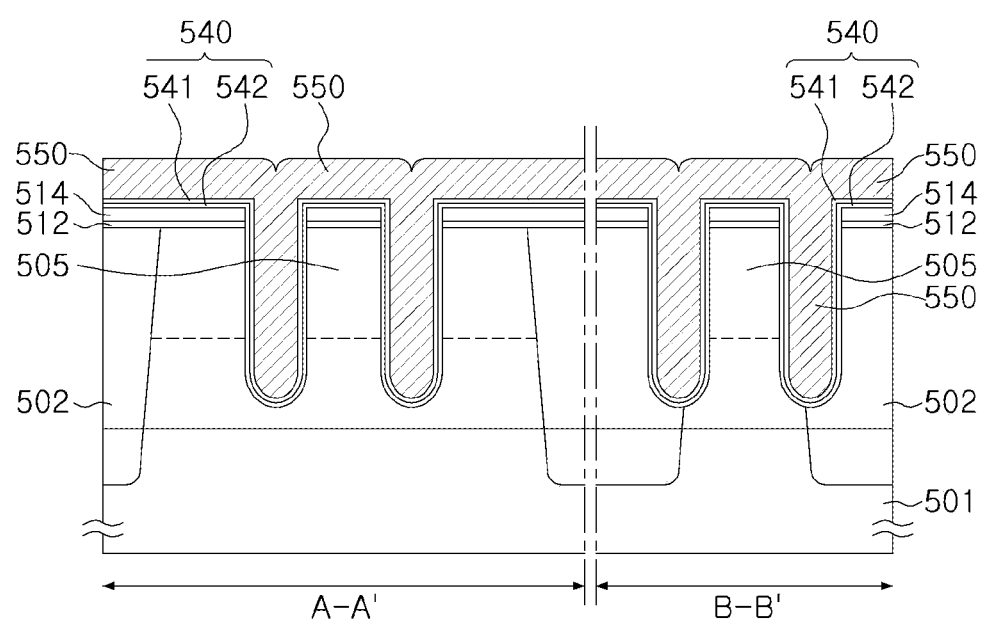
Figure 13C:
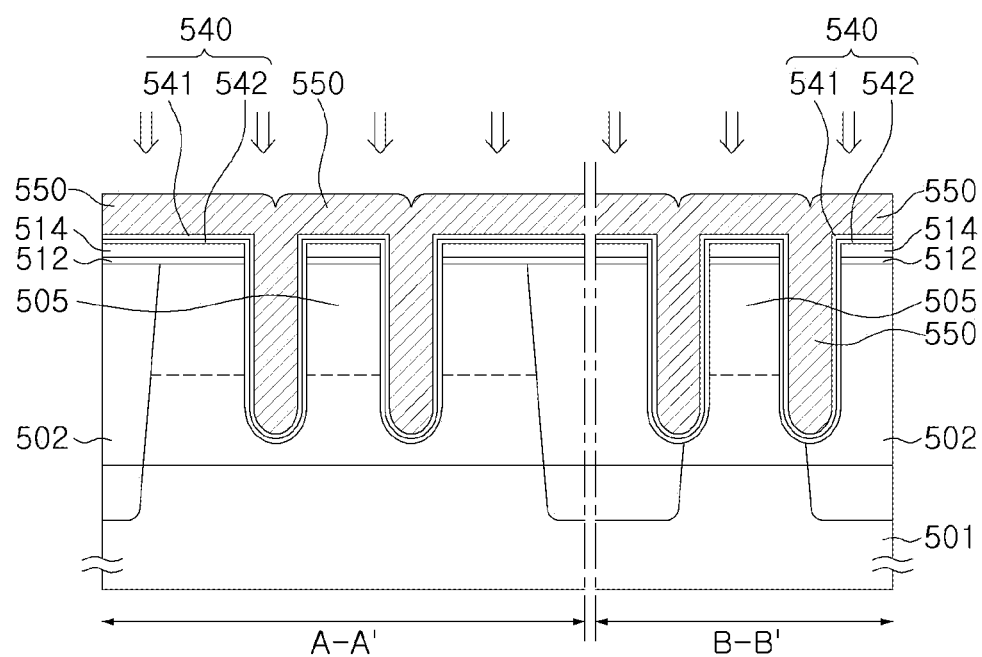
Figure 13D:
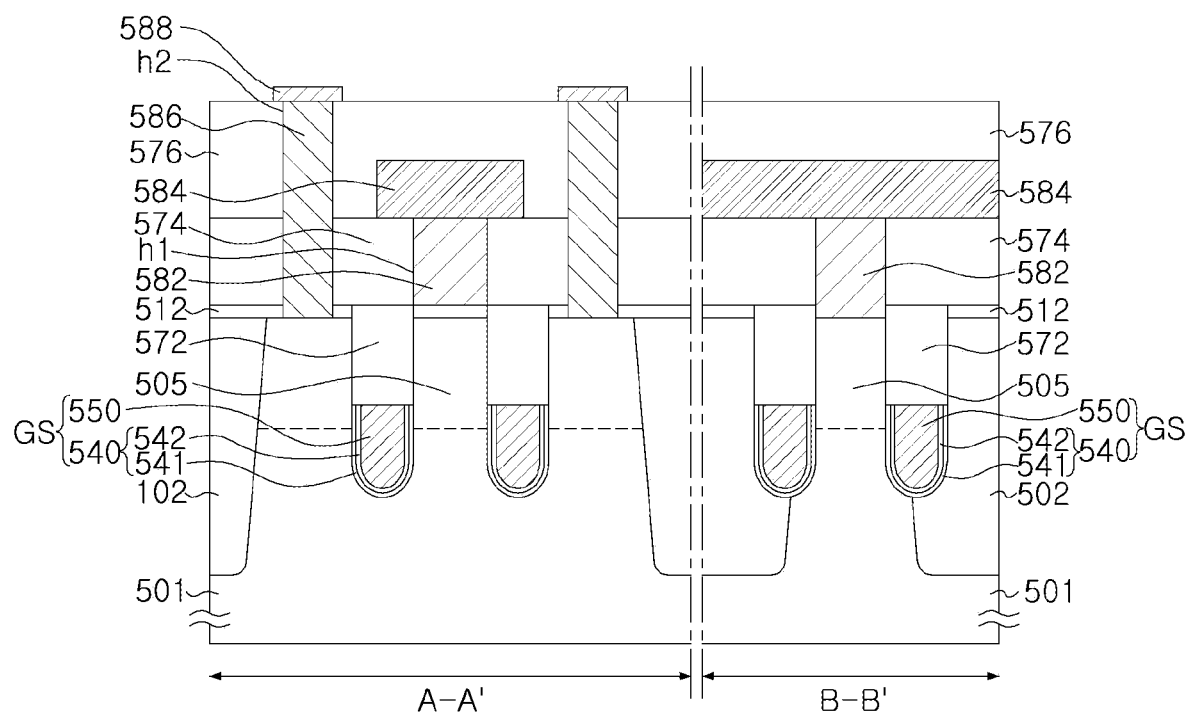

Referring to FIGS. 12 and 13D, in the semiconductor device according to the present example embodiment, a device isolation film 502 defining a plurality of active regions ACT may be formed in a cell region of a substrate 501. The plurality of gate structures G may extend in a desired and/or alternatively predetermined direction (a vertical axis direction of FIG. 12) over the active region ACT and the device isolation layer 502 region. In this case, the plurality of gate structures G may be buried in the substrate 501. The plurality of bit lines BL may extend in a direction substantially perpendicular to the extending direction of the plurality of gate structures G.

First, referring to FIG. 13A, a device isolation film 502 defining an active region may be formed on a substrate 501. The device isolation film 502 may be formed using a shallow trench isolation (STI) process. Thereafter, an impurity region 505 may be formed by implanting impurities on the active region of the substrate 501. The impurities may be n-type impurities such as phosphorus (P) and arsenic (As), or p-type impurities such as boron (B).

A pad oxide film pattern 512 and a mask pattern 514 exposing a portion of the upper surface of the substrate 501 may be formed on the substrate 501. The mask pattern 514 may be a hard mask made of a nitride film or a polysilicon film. In a specific example, the mask pattern 514 may have a stacked structure of a hard mask and a photoresist.

A trench T may be formed in the substrate 501 by using the mask pattern 114. Since a gate electrode G is formed inside the trench T in a subsequent process, the trench T may be arranged in a shape similar to that of the gate electrode G in the layout of FIG. 12.

Subsequently, referring to FIG. 13B, a gate insulating film 540 and a gate electrode 550 may be sequentially formed on the surface of the substrate 501 exposed from an inner wall of the trench T.

The gate insulating film 540 may be the dielectric described in the previous example embodiment, particularly, a dielectric having a high dielectric constant. The gate insulating film 540 employed in the present example embodiment may include a first dielectric film 541 having a first dielectric constant, and a second dielectric layer 542 disposed on the first dielectric layer 541 and having a second dielectric constant, higher than the first dielectric constant. For example, the first dielectric film 541 may include a low dielectric material such as silicon oxide and/or silicon oxynitride, and the second dielectric film 542 may include high dielectric material such as aluminum oxide, hafnium oxide, hafnium silicon oxide, or zirconium oxide.

The gate electrode 550 may be formed on the gate insulating film 540 in a subsequent process. For example, the gate electrode 550 may include metal such as copper (Cu), titanium (Ti), tantalum (Ta), ruthenium (Ru), tungsten (W), cobalt (Co), nickel (Ni), aluminum (Al), hafnium (Hf), zirconium (Zr), palladium (Pd), platinum (Pt), and molybdenum (Mo), or silicides such as WSi, and nitrides or oxynitrides such as TiN, TaN, TiON, TaON.

Next, referring to FIG. 13C, the gate stacks 540 and 550 may be subjected to a reduction treatment using hydrogen radicals or hydrogen plasma.

The gate insulating film 540 may be cured by performing a reduction treatment using hydrogen radicals or hydrogen plasma. In this reduction process, the quality of the gate insulating film 540 may be greatly improved by curing to fill the oxygen vacancy present in the gate insulating film 540. The reduction treatment employed in the present example embodiment may be performed even at a temperature lower than a normal annealing temperature (e.g., 600° C. or lower).

Next, referring to FIG. 13D, a gate structure GS may be completed and a wiring structure may be formed.

The gate structure GS may be formed in a trench T by etching back to the gate insulating film 540 and the gate electrode 550. After forming an insulating material (not shown) filling the trench T on the gate electrode 550, a capping portion 572 may be formed in the trench T by planarizing the insulating material. Accordingly, the gate insulating film 540 and the gate electrode 550 sequentially formed in the trench T may form a gate structure GS. The gate structure GS may be formed by being buried in the substrate 501.

A first interlayer insulating film 574 may be formed on the pad oxide film pattern 512 and the capping portion 572. A first opening h1 may be formed through the first interlayer insulating film 574 and the pad oxide film pattern 512 to expose an impurity region 505, and a conductive film filling the first opening h1 may be formed as a first interlayer insulating film 574. By planarizing the conductive layer until the first interlayer insulating film 574 is exposed, a bit line contact 582 electrically connected to the impurity region 505 may be formed. By forming a conductive film on the first interlayer insulating film 574 and patterning the conductive film, a bit line 584 connected to the bit line contact 582 may be formed on the first interlayer insulating film 574. Subsequently, a second interlayer insulating film 576 covering the bit line 574 may be formed on the first interlayer insulating film 574.

After forming a second opening h2 exposing the impurity region 505 through the first and second interlayer insulating films 574 and 576 and the pad oxide film pattern 512, a capacitor contact 586 filling the second opening h2 may be formed. A contact pad 588 may be formed on the capacitor contact 586 and the second interlayer insulating film 576.

Figure 13E:
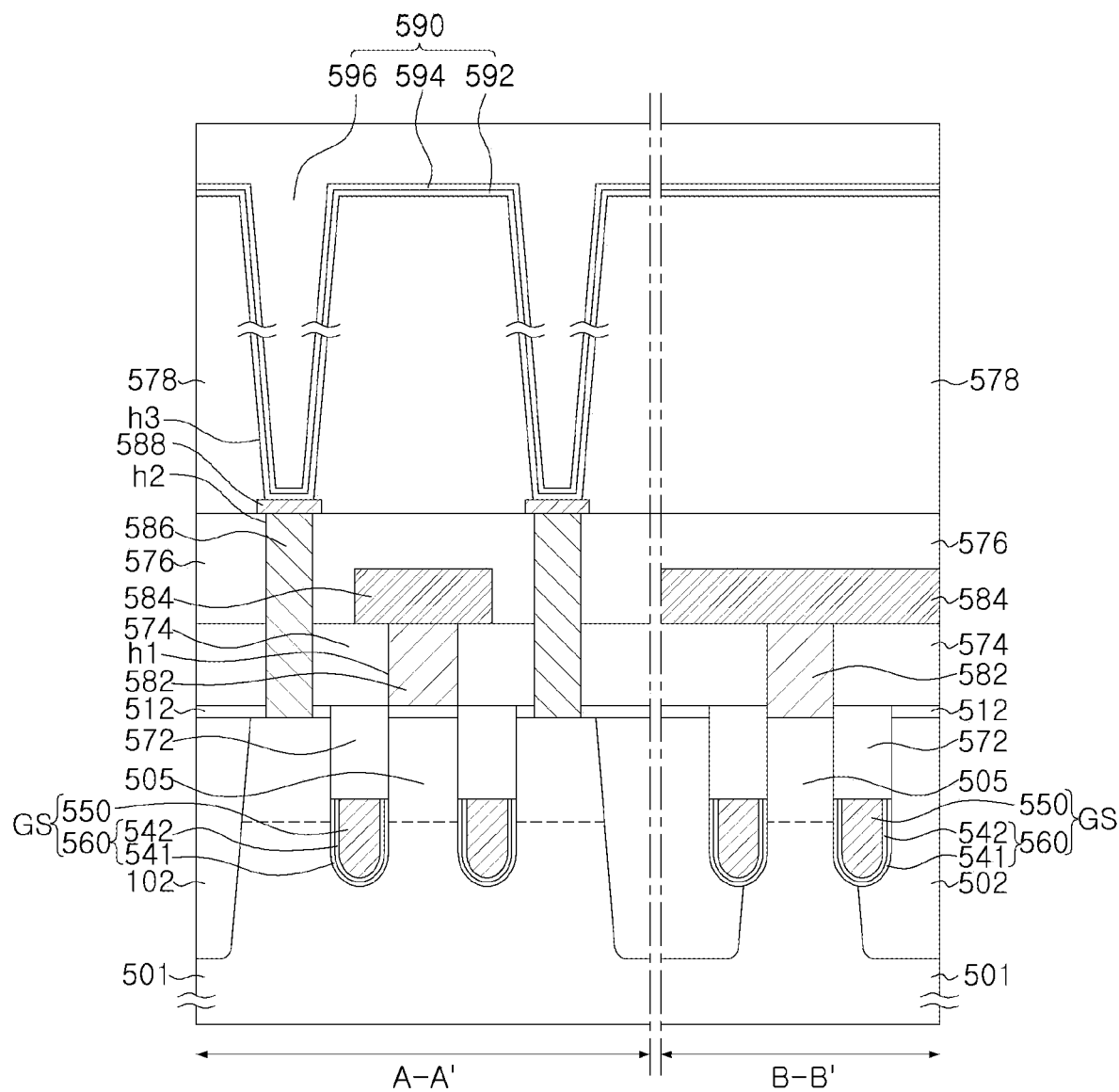

Subsequently, referring to FIG. 13E, a capacitor 590 may be formed on the contact pad 588.

The capacitor 590 may include a lower electrode 592, a dielectric layer 594 and an upper electrode 596. Two holes h3 for forming the capacitor 590 may be formed on a third interlayer insulating film 578. Each of the capacitors 590 may be formed on each side of each active region with two buried gate electrodes 550 passing through the active region ACT therebetween. The lower electrode 592 of the capacitor 590 may be connected to one and formed in the two holes h3. The lower electrode 592 of the capacitor 590 may be electrically connected to the impurity region 505 in the active region through a contact pad 588.

As described above, in a semiconductor device such as a DRAM, defects in the gate insulating film can be effectively cured by the reduction treatment using hydrogen radicals. As a result, the semiconductor device can reduce the gate leakage current and greatly improve the NBTI characteristics related to dielectric defects.

In the present example embodiment, a case of a buried word line (a gate electrode) constituting a buried channel array transistor (BCAT) is illustrated, but is not limited thereto. For example, a peripheral circuit region in which peripheral circuits are formed may be further formed on the substrate 501 in addition to the cell region, and may be advantageously applied to transistors in the peripheral circuit region, similar to the method of forming a gate insulating film in the cell region.

Figure 14:
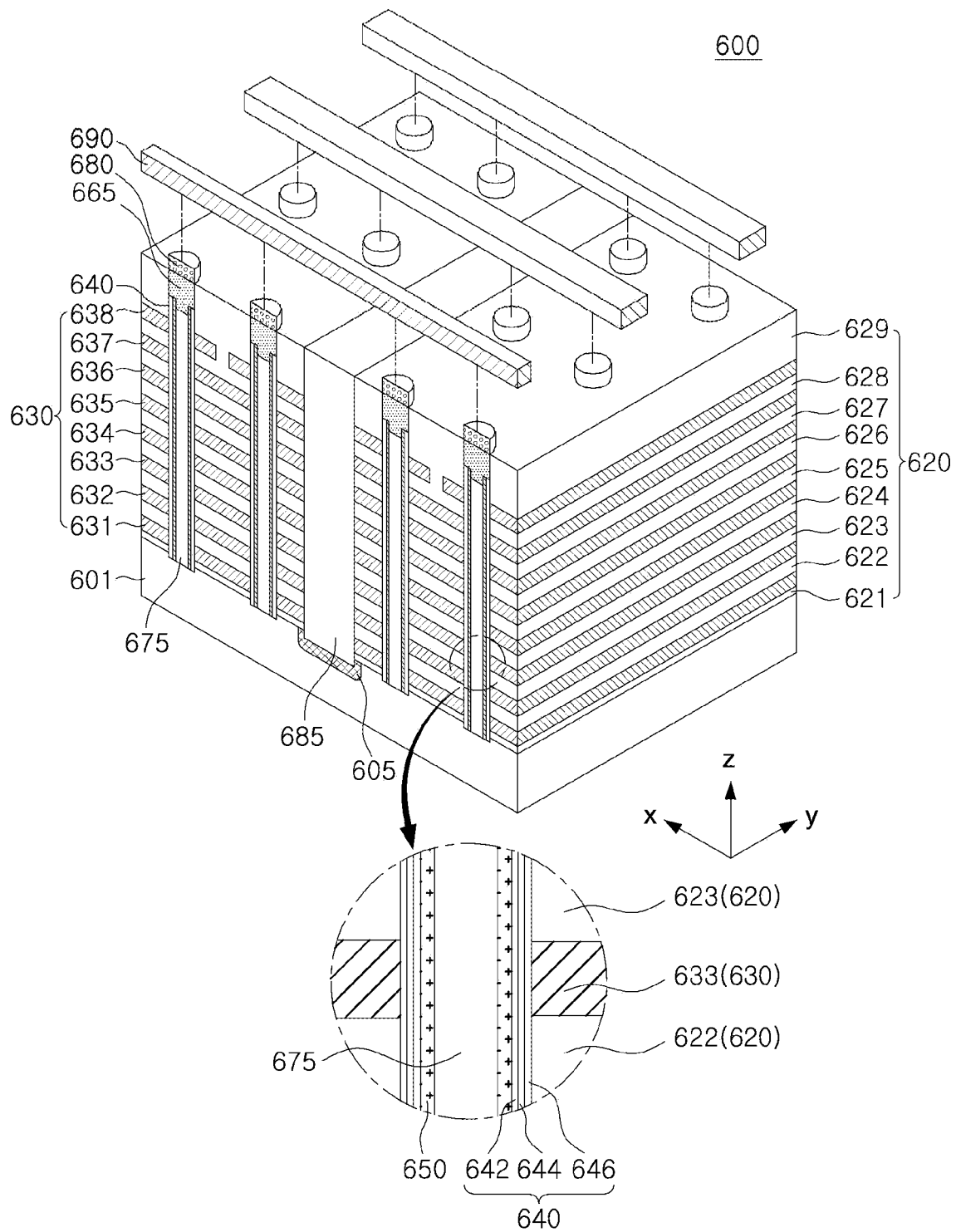
FIG. 14 is a perspective view illustrating a semiconductor device according to an example embodiment of inventive concepts.

FIG. 14 is a perspective view illustrating a semiconductor device according to an example embodiment of inventive concepts.

Referring to FIG. 14, a nonvolatile memory device 600 according to the present example embodiment may include a channel region 650 disposed in a direction perpendicular to an upper surface of a substrate 601, a plurality of interlayer insulating layers 620 and 621-629 stacked along an outer sidewall of the channel region 650, and a plurality of gate electrodes 630 and 631 to 638. The plurality of interlayer insulating layers 621-629 may be arranged between the plurality of gate electrodes 631 to 638.

In addition, the nonvolatile memory device 600 may further include a gate insulating film 640 disposed between the gate electrode 630 and the channel region 650, and may include a bit line 690 disposed above the channel region 650. The gate insulating film 640 employed in the present example embodiment may also be a result of curing defects through reduction treatment by hydrogen radicals. The gate insulating film 640 may include a tunneling layer 642 (e.g., silicon oxide), charge trap layer 644 (e.g., silicon nitride), and a gate insulating layer 646 (silicon oxide). In some embodiments, the tunneling layer 642 and/or gate insulating layer 646 may include at least one selected of silicon oxide, silicon oxynitride, aluminum oxide, hafnium oxide, hafnium silicon oxide, and zirconium oxide.

In the present example embodiment, one memory cell string may be formed around each channel region 650, and a plurality of memory cell strings may be arranged in columns and rows in a x direction and a y direction. The substrate 601 may have an upper surface extending in the x and y directions. The columnar channel region 650 may be disposed to extend in a direction perpendicular to the upper surface of the substrate 601 (z direction). The channel region 650 may be formed in an annular shape surrounding a buried insulating layer 675 therein, but may have a pillar shape such as a cylindrical shape or a prism without the buried insulating layer 675 according to example embodiments. In addition, the channel region 650 may have an inclined side surface that narrows as it approaches the substrate 601 according to an aspect ratio.

At the top of the memory cell string, a drain region 665 may be disposed to cover an upper surface of the buried insulating layer 675 and be electrically connected to the channel region 650. The drain region 665 may include, for example, doped polysilicon. A drain plug 680 (e.g., metal plug) may be formed on the drain region 665 for electrically connecting the bit line 690 to the drain region 665.

A source region 605 of a ground selection transistor arranged in the x direction may be disposed below the memory cell string. The source region 605 may be arranged adjacent to the upper surface of the substrate 601 while extending in the y direction and spaced apart by a desired and/or alternatively predetermined unit in the x direction. For example, the source region 605 may be arranged one for each of the two channel regions 650 in the x direction, but is not limited thereto. An isolation insulating layer 685 may be formed on the source region 605.

The channel region 650 may be disposed to be spaced apart from each other in the x and y directions. However, the arrangement of the channel regions 650 may be variously modified and implemented unlike the present example embodiment. For example, the channel regions 650 may be disposed in a zig-zag shape in at least one direction. The channel region 650 may be in direct contact with the substrate 601 on a lower surface thereof to be electrically connected thereto. The channel region 650 may include a semiconductor material such as polysilicon or single crystal silicon, and the semiconductor material may be an undoped material or a material including p-type or n-type impurities.

As set forth above, according to inventive concepts, it is possible to improve reliability of the gate insulating film and improve characteristics of leakage currents by performing a reduction treatment using hydrogen radicals or hydrogen plasma by replacing a high-treatment annealing process. In particular, a low-temperature reduction treatment may be applied to the gate insulating film of the upper device layer of the three-dimensional semiconductor device according to the present example embodiment, such that it is possible to limit and/or prevent adverse effects on the lower device layer and the wiring structure.

The various and features and effects of inventive concepts may be not limited to those described above, and may be more easily understood in the course of describing a specific embodiment of inventive concepts.

While example embodiments have been illustrated and described above, it will be apparent to those skilled in the art that modifications and variations could be made without departing from the scope of inventive concepts as defined by the appended claims.

What is claimed is:

1. A method of manufacturing a semiconductor device, comprising steps of:
   preparing a semiconductor substrate having an active region;
   forming a gate stack including a gate insulating film and a gate electrode on the active region;
   performing a reduction treatment on the gate stack using hydrogen radicals or hydrogen plasma; and
   removing a portion of the gate electrode in the gate stack after the performing the reduction treatment.

2. The method of manufacturing the semiconductor device of claim 1, further comprising forming a capping layer between the forming the gate stack and the performing the reduction treatment, and removing the capping layer after the performing the reduction treatment.

3. The method of manufacturing the semiconductor device of claim 2, wherein the capping layer comprises silicon (Si) and silicon oxide ($SiO_2$).

4. The method of manufacturing the semiconductor device of claim 1, wherein the performing the reduction treatment comprises supplying additional reducing gas-containing plasma.

5. The method of manufacturing the semiconductor device of claim 1, wherein the performing the reduction treatment comprises adding oxygen or an oxygen isotope.

6. The method of manufacturing the semiconductor device of claim 1, wherein the performing the reduction treatment is performed 600° C. or lower.

7. A method of manufacturing a three-dimensional semiconductor device, comprising steps of:
   forming a plurality of first transistors each having a first gate insulating film and a first gate electrode on a first substrate;
   forming a first conductive line on the plurality of first transistors;
   forming a second substrate on the first conductive line;
   forming a plurality of second transistors each having a second gate insulating film and a second gate electrode on the second substrate; and
   forming a second conductive line on the plurality of second transistors and a through-via connecting the first and second conductive lines,
   wherein the forming of the plurality of second transistors comprises forming a gate stack including the second gate insulating film and the second gate electrode on the first substrate; and performing a reduction treatment on the gate stack using hydrogen radicals or hydrogen plasma.

8. The method of manufacturing the three-dimensional semiconductor device of claim 7, wherein the forming the plurality of first transistors comprises annealing the first gate insulating film at a first temperature, and
   the performing the reduction treatment is performed at a second temperature, lower than the first temperature.

9. The method of manufacturing the three-dimensional semiconductor device of claim 8, wherein the second temperature is 600° C. or lower.

10. The method of manufacturing the three-dimensional semiconductor device of claim 7, further comprising forming a capping layer between the forming the gate stack and the performing the reduction treatment.

11. The method of manufacturing the three-dimensional semiconductor device of claim 10, wherein the capping layer comprises a semiconductor layer and an oxide layer.

12. The method of manufacturing the three-dimensional semiconductor device of claim 10, further removing the capping layer after the performing the reduction treatment.

13. The method of manufacturing the three-dimensional semiconductor device of claim 7, wherein the performing the reduction treatment comprises supplying additional reducing gas-containing plasma.

14. The method of manufacturing the three-dimensional semiconductor device of claim 13, wherein the additional reducing gas comprises at least one selected from a group consisting of Ar, He, $N_2$, $NH_3$, and a hydrogen (H) isotope.

15. The method of manufacturing the three-dimensional semiconductor device of claim 7, wherein the performing the reduction treatment comprises adding oxygen or an oxygen isotope.

16. The method of manufacturing the three-dimensional semiconductor device of claim 7, wherein the first gate insulating film has a first hydrogen content, and the second gate insulating film has a second hydrogen content greater than the first hydrogen content.

17. The method of manufacturing the three-dimensional semiconductor device of claim 16, wherein the second hydrogen content is 10% or more greater than the first hydrogen content.

18. The method of manufacturing the three-dimensional semiconductor device of claim 7, wherein a thickness of the second substrate is less than a thickness of the first substrate.

19. The method of manufacturing the three-dimensional semiconductor device of claim 18, wherein the thickness of the second substrate is about 2 μm or less.

20. A method of manufacturing a three-dimensional semiconductor device, comprising:
   forming a first device layer having a first substrate, and a plurality of first transistors each having a first gate insulating film on an upper surface of the first substrate and a first gate electrode on the first gate insulating film; and
   forming a second device layer having a second substrate on the plurality of first transistors, and a plurality of second transistors each having a second gate insulating film on an upper surface of the second substrate and a second gate electrode on the second gate insulating film, the plurality of second transistors electrically connected to the plurality of first transistors,
   wherein at least one of the first and second device layers further includes a memory cell array, and
   wherein the forming of the plurality of second transistors comprises forming a gate stack including the second gate insulating film and the second gate electrode on the first substrate;
   and performing a reduction treatment on the gate stack using hydrogen radicals or hydrogen plasma.

* * * * *